US008952315B2

(12) United States Patent
Ohta et al.

(10) Patent No.: US 8,952,315 B2
(45) Date of Patent: Feb. 10, 2015

(54) SOLID-STATE IMAGING DEVICE HAVING A VERTICAL TRANSISTOR WITH A DUAL POLYSILICON GATE

(75) Inventors: Kazunobu Ohta, Kanagawa (JP); Tomoyuki Hirano, Kanagawwa (JP)

(73) Assignee: Sony Corporation, Tokyo (JP)

( * ) Notice: Subject to any disclaimer, the term of this patent is extended or adjusted under 35 U.S.C. 154(b) by 642 days.

(21) Appl. No.: 12/574,494

(22) Filed: Oct. 6, 2009

(65) Prior Publication Data
US 2010/0108864 A1      May 6, 2010

(30) Foreign Application Priority Data
Oct. 30, 2008    (JP) ................................ 2008-279471

(51) Int. Cl.
*H01L 27/00*      (2006.01)
*H01L 31/00*      (2006.01)
(Continued)

(52) U.S. Cl.
CPC .... *H01L 27/14614* (2013.01); *H01L 27/14634* (2013.01); *H01L 27/14689* (2013.01); *H01L 29/66666* (2013.01)
USPC ........................ 250/214.1; 250/208.1; 257/292

(58) Field of Classification Search
CPC ................... H01L 27/10823; H01L 27/14831; H01L 27/148; H01L 27/2454; H01L 27/14612; H01L 27/14679; H01L 27/14609; H01L 27/14614; H01L 27/14643; H01L 27/14689; H01L 27/14603; H01L 27/732; H01L 29/78642; H01L 29/42396; H01L 31/062; H01L 31/113; H01L 21/336; H01L 29/6666; H01L 27/14634; H04N 5/335; H04N 9/045; H04N 5/374

USPC ........ 250/208.1, 214.1, 214 R, 239; 257/290, 257/292, 291, 293, 215, 222, 242, 244, 256, 257/257, 258, 431, 446, 461; 438/73, 75, 438/77, 60; 348/311, 308, 294, 302, 303, 348/304
See application file for complete search history.

(56) References Cited

U.S. PATENT DOCUMENTS 7,217,968 B2 *   5/2007   Adkisson et al. ............. 257/292
7,629,219 B2 *   12/2009   Lim et al. ...................... 438/270
(Continued)

FOREIGN PATENT DOCUMENTS

JP      05-090555      4/1993
JP      2001-189456      7/2001
(Continued)

*Primary Examiner* — Que T Le
*Assistant Examiner* — Jennifer Bennett
(74) *Attorney, Agent, or Firm* — Robert J. Depke; The Chicago Technology Law Group, LLC

(57) ABSTRACT

A solid-state imaging device includes: a pixel part having a photoelectric conversion part photoelectrically converting incident light to obtain signal charge; and a peripheral circuit part formed on a periphery of the pixel part on a semiconductor substrate. The pixel part having a vertical transistor that reads out the signal charge from the photoelectric conversion part and a planar transistor that processes the signal charge read out by the vertical transistor. The vertical transistor has a groove part formed on the semiconductor substrate; a gate insulator film formed on an inner surface of the groove part; a conducting layer formed on a surface of the gate insulator film on the semiconductor substrate within and around the groove part; a filling layer filling an interior of the groove part via the gate insulator film and the conducting layer; and an electrode layer connected to the conducting layer on the filling layer.

7 Claims, 23 Drawing Sheets

(51) Int. Cl.
*H01L 31/113* (2006.01)
*H01L 27/146* (2006.01)
*H01L 29/66* (2006.01)

(56) References Cited

U.S. PATENT DOCUMENTS

| | | | |
|---|---|---|---|
| 2002/0155664 A1* | 10/2002 | Noro | 438/263 |
| 2003/0141436 A1* | 7/2003 | Koizumi et al. | 250/208.1 |
| 2003/0169360 A1* | 9/2003 | Rhodes | 348/308 |
| 2005/0167704 A1* | 8/2005 | Ezaki et al. | 257/233 |
| 2007/0007611 A1* | 1/2007 | Park et al. | 257/431 |
| 2009/0014789 A1* | 1/2009 | Manabe | 257/334 |

FOREIGN PATENT DOCUMENTS

| | | |
|---|---|---|
| JP | 2001-320051 | 11/2001 |
| JP | 2002-313945 | 10/2002 |
| JP | 2005-223084 | 8/2005 |
| JP | 2005-285980 | 10/2005 |
| JP | 2007-123551 | 5/2007 |
| WO | WO 2007-058042 | 5/2007 |

* cited by examiner

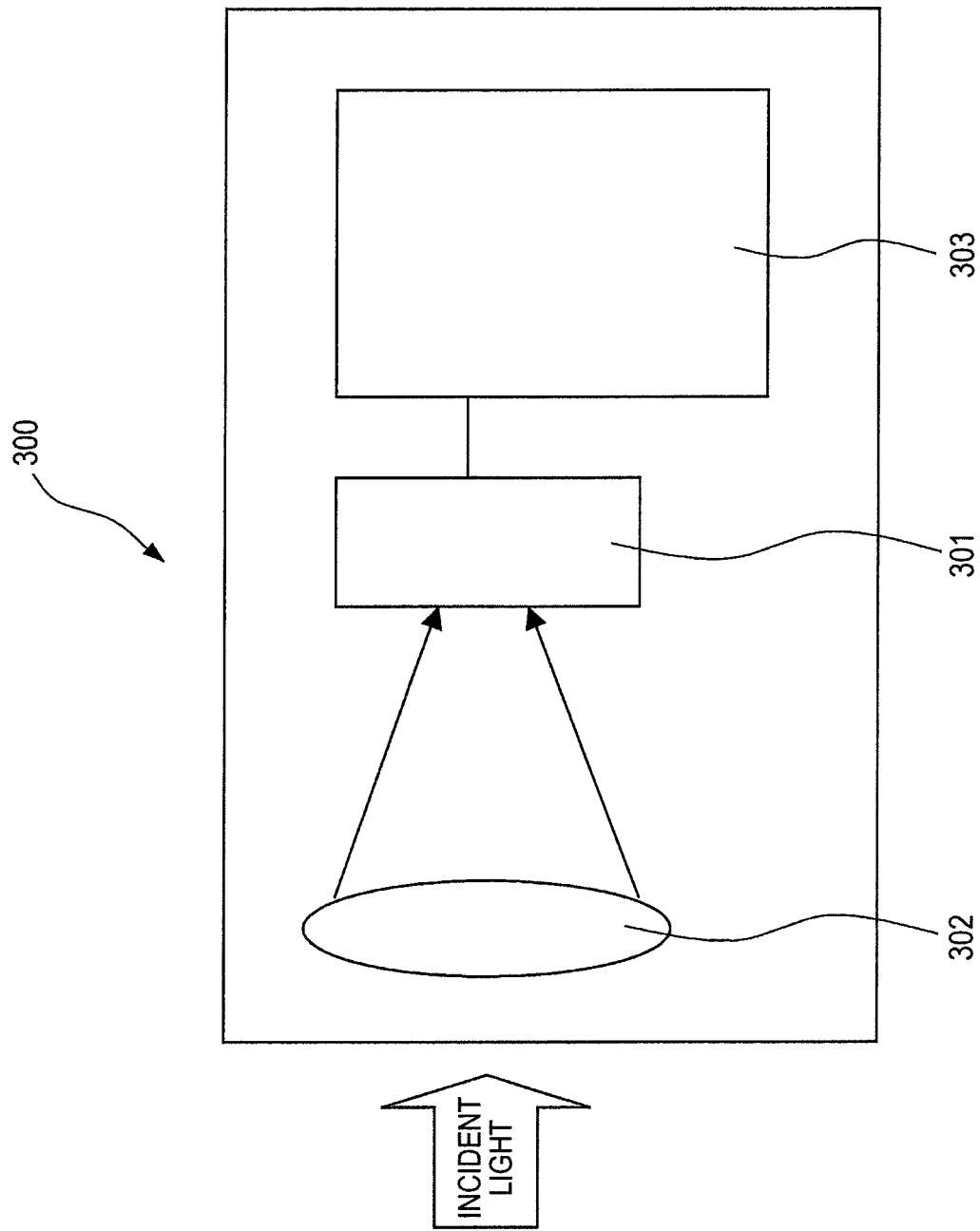

SOLID-STATE IMAGING DEVICE HAVING A VERTICAL TRANSISTOR WITH A DUAL POLYSILICON GATE

The present application claims priority to Japanese Patent Application JP 2008-279471 filed in the Japan Patent Office on Oct. 30, 2008, the entire contents of which is hereby incorporated by reference.

BACKGROUND OF THE INVENTION

1. Field of the Invention

The present invention relates to a solid-state imaging device, a manufacturing method of the same, and an imaging apparatus.

2. Description of Related Art

A solid-state imaging device including both a vertical transistor and a planar transistor is disclosed (e.g., see JP-A-2005-223084).

It is very difficult to make both the vertical transistor and a CMOSFET (e.g., CMOSFET following the design rule of 0.18 μm or less) including the planar transistor on the same substrate.

For example, the case where non-doped polysilicon is used for the respective gate electrodes of the vertical transistor and the planar transistor will be described.

When a vertical hole of the vertical transistor is filled with non-doped polysilicon for gate electrode and closed, it becomes difficult to dope the polysilicon in the deep part of the vertical hole in the substrate.

For example, there is a method of filling the vertical hole forming the vertical transistor with polysilicon, and then, diffusing an impurity at high density of $1 \times 10^{20}$ cm$^{-3}$ from the surface to the bottom of the polysilicon filling in the vertical hole by thermal diffusion (see JP-A-2001-189456).

However, if the heat that diffuses the impurity at high density of $1 \times 10^{20}$ cm$^{-3}$ to the bottom of the polysilicon filling in the vertical hole is applied, in the planar CMOSFET part, the device isolation function is deteriorated due to thermal diffusion of the device isolation region formed by the diffusion layer. Further, if the impurity is allowed to reach the bottom of the vertical hole by ion implantation, the high-density impurity is implanted into the silicon substrate, and it may be impossible to form the channel of the vertical transistor.

Accordingly, it has been difficult to mount both the planar CMOSFET and the vertical transistor on the same semiconductor substrate.

SUMMARY OF THE INVENTION

There is need for solving the problem that it is difficult to mount both the planar CMOSFET and the vertical transistor on the same semiconductor substrate.

The present allows both a planar CMOSFET and a vertical transistor be mounted on the same semiconductor substrate using a thin film formed via a gate insulator film on the inner surface of a groove in which the vertical transistor is formed as an effective gate electrode.

A solid-state imaging device according to an embodiment of the invention includes a pixel part having a photoelectric conversion part that photoelectrically converts incident light to obtain signal charge and a peripheral circuit part formed on a periphery of the pixel part on a semiconductor substrate, the pixel part has a vertical transistor that reads out the signal charge from the photoelectric conversion part and a planar transistor that processes the signal charge read out by the vertical transistor, the vertical transistor has a groove part formed on the semiconductor substrate, a gate insulator film formed on an inner surface of the groove part, a conducting layer formed on a surface of the gate insulator film on the semiconductor substrate within and around the groove part, a filling layer filling an interior of the groove part via the gate insulator film and the conducting layer, and an electrode layer connected to the conducting layer on the filling layer.

In the solid-state imaging device according to the embodiment of the invention, the gate electrode is formed by the conducting layer on the inner surface of the groove part via the gate insulator film, the filling layer filling the interior of the groove part, and the electrode layer connected to the conducting layer. Effectively, the conducting layer has a function of the gate electrode. Therefore, it is not necessary to fill the groove part with the conducting layer, and thus, it is not necessary to diffuse the impurity to the bottom of the groove part in the polysilicon filling the groove part by high-temperature heat treatment for forming the gate electrode unlike the technology in the past. Further, it is not necessary to perform ion implantation with high energy to allow the implanted ions to reach the bottom of the groove part in the polysilicon filling the groove part.

A manufacturing method of a solid-state imaging device (a first manufacturing method) according to an embodiment of the invention includes the step of forming a pixel part having a photoelectric conversion part that photoelectrically converts incident light to obtain an electric signal, a vertical transistor that reads out signal charge from the photoelectric conversion part, and a planar transistor that processes the read out signal charge, and a peripheral circuit part having a first conductivity-type-channel transistor and a second conductivity-type-channel opposite to the first conductivity-type on a periphery of the pixel part on a semiconductor substrate, and the step of forming gate electrodes of the respective transistors of the pixel part and the peripheral circuit part includes the steps of forming a groove part in a region where the gate electrode of the vertical transistor is formed on the semiconductor substrate, forming a gate insulator film on a surface of the semiconductor substrate containing an inner surface of the groove part, forming a first polysilicon film on the semiconductor substrate containing the inner surface of the groove part under a non-doped condition via the gate insulator film, forming a conducting layer by doping a first conductivity-type impurity on the first polysilicon film in a pixel part formation region where the pixel part is formed, forming a second polysilicon film also filling an interior of the groove part on the first polysilicon film under a non-doped condition, doping the first conductivity-type impurity in the second polysilicon film in a region where the first conductivity-type-channel transistor is formed in the pixel part formation region and a peripheral circuit part formation region where the peripheral circuit part is formed, and doping a second conductivity-type impurity in the second polysilicon film and the first polysilicon film in a region where the second conductivity-type-channel transistor is formed, and forming the gate electrode of the vertical transistor, the gate electrode of the planar transistor of the pixel part, and the gate electrodes of the respective transistors of the peripheral circuit part with the first polysilicon film and the second polysilicon film.

In the first manufacturing method of a solid-state imaging device according to the embodiment of the invention, the conducting layer that effectively functions as the gate electrode is formed by doping the conductivity-type impurity in the first polysilicon film formed on the inner surface of the groove part via the gate insulator film. Further, the gate electrode is formed by the filling layer of the non-doped second polysilicon film filling the interior of the groove part and the electrode layer of the second polysilicon film doped with the first conductivity-type impurity connected to the first polysilicon film. Effectively, the conducting layer has a function of the gate electrode. Therefore, it is not necessary to fill the groove part with the conducting layer, and thus, it is not necessary to diffuse the impurity to the bottom of the groove part in the polysilicon filling the groove part by high-temperature heat treatment for forming the gate electrode unlike the technology in the past. Further, it is not necessary to perform ion implantation with high energy to allow the implanted ions to reach the bottom of the groove part in the polysilicon filling the groove part.

Further, the gate electrodes of the planar transistors of the pixel part and the peripheral circuit part are formed by doping a predetermined conductivity-type impurity in the non-doped first polysilicon film and the non-doped second polysilicon film. Accordingly, the gate electrode of the N-channel-type transistor and the gate electrode of the P-channel-type transistor are separately formed in N-type and P-type, respectively. In addition, the gate electrode having a minute gate length can be formed.

A manufacturing method of a solid-state imaging device (a second manufacturing method) according to an embodiment of the invention includes the step of forming a pixel part having a photoelectric conversion part that photoelectrically converts incident light to obtain an electric signal, a vertical transistor that reads out signal charge from the photoelectric conversion part, and a planar transistor that processes the readout signal charge, and a peripheral circuit part having a first conductivity-type-channel transistor and a second conductivity-type-channel opposite to the first conductivity-type on a periphery of the pixel part on a semiconductor substrate, and the step of forming gate electrodes of the respective transistors of the pixel part and the peripheral circuit part includes the steps of forming a groove part in a region where the vertical transistor is formed on the semiconductor substrate, forming a gate insulator film on a surface of the semiconductor substrate containing an inner surface of the groove part, forming a polysilicon film on the semiconductor substrate containing the inner surface of the groove part under a non-doped condition via the gate insulator film, doping a first conductivity-type impurity on the polysilicon film in a region where the first conductivity-type-channel transistor is formed in a pixel part formation region where the pixel part is formed and a peripheral circuit part formation region where the peripheral circuit part is formed, doping a second conductivity-type impurity in the polysilicon film in a region where the second conductivity-type-channel transistor is formed in the peripheral circuit part formation region, forming a metal film on the polysilicon film, and forming the gate electrode of the vertical transistor, the gate electrode of the planar transistor of the pixel part and the gate electrodes of the respective transistors of the peripheral circuit part with the polysilicon film and the metal film.

In the second manufacturing method of a solid-state imaging device according to the embodiment of the invention, the conducting layer that effectively functions as the gate electrode is formed by doping the conductivity-type impurity in the polysilicon film formed on the inner surface of the groove part via the gate insulator film. Further, the gate electrode is formed by the filling layer of the metal film filling the interior of the groove part and the electrode layer connected to the conducting layer. Effectively, the conducting layer has a function of the gate electrode. Therefore, it is not necessary to fill the groove part with the conducting layer, and thus, it is not necessary to diffuse the impurity to the bottom of the groove part in the polysilicon filling the groove part by high-temperature heat treatment for forming the gate electrode unlike the technology in the past. Further, it is not necessary to perform ion implantation with high energy to allow the implanted ions to reach the bottom of the groove part in the polysilicon filling the groove part.

Further, the gate electrodes of the planar transistors of the pixel part and the peripheral circuit part are formed by doping a predetermined conductivity-type impurity in the non-doped polysilicon film. Accordingly, the gate electrode of the N-channel-type transistor and the gate electrode of the P-channel-type transistor are separately formed in N-type and P-type, respectively. In addition, the gate electrode having a minute gate length can be formed.

A manufacturing method of a solid-state imaging device (a third manufacturing method) according to an embodiment of the invention includes the step of forming a pixel part having a photoelectric conversion part that photoelectrically converts incident light to obtain an electric signal, a vertical transistor that reads out signal charge from the photoelectric conversion part, and a planar transistor that processes the readout signal charge, and a peripheral circuit part having a first conductivity-type-channel transistor and a second conductivity-type-channel opposite to the first conductivity-type on a periphery of the pixel part on a semiconductor substrate, and the step of forming gate electrodes of the respective transistors of the pixel part and the peripheral circuit part includes the steps of forming a groove part in a region where the vertical transistor is formed on the semiconductor substrate, forming a gate insulator film on a surface of the semiconductor substrate containing an inner surface of the groove part, forming a metal film or a metal compound film on the semiconductor substrate containing the inner surface of the groove part in a pixel part formation region via the gate insulator film, forming a polysilicon film on the gate insulator film containing the metal film or the metal compound film under a non-doped condition, doping a first conductivity-type impurity in the polysilicon film in a pixel part formation region where the pixel part is formed and the polysilicon film in a region where the first conductivity-type-channel transistor is formed in a peripheral circuit part formation region where the peripheral circuit part is formed and doping a second conductivity-type impurity in the polysilicon film in a region where the second conductivity-type-channel transistor is formed in the peripheral circuit part formation region, and forming the gate electrode of the vertical transistor, the gate electrode of the planar transistor of the pixel part, and the gate electrodes of the respective transistors of the peripheral circuit part with the metal film or the metal compound film and the polysilicon film.

In the third manufacturing method of a solid-state imaging device according to the embodiment of the invention, the metal film or the metal compound film formed on the inner surface of the groove part via the gate insulator film effectively functions as the gate electrode. Further, the gate electrode is formed by the filling layer of the non-doped polysilicon film filling the interior of the groove part and the polysilicon film doped with the first conductivity-type impurity connected to the metal film or the metal compound film. Effectively, the metal film or the metal compound film has a function of the gate electrode. Therefore, it is not necessary to fill the groove part with the metal film or the metal compound film, and thus, it is not necessary to diffuse the impurity to the bottom of the groove part in the polysilicon filling the groove part by high-temperature heat treatment for forming the gate electrode unlike the technology in the past. Further, it is not necessary to perform ion implantation with high energy to allow the implanted ions to reach the bottom of the groove part in the polysilicon filling the groove part.

Further, the gate electrodes of the planar transistors of the pixel part and the peripheral circuit part are formed by doping a predetermined conductivity-type impurity in the non-doped polysilicon. Accordingly, the gate electrode of the N-channel-type transistor and the gate electrode of the P-channel-type transistor are separately formed in N-type and P-type, respectively. In addition, the gate electrode having a minute gate length can be formed.

A manufacturing method of a solid-state imaging device (a fourth manufacturing method) according to an embodiment of the invention includes the step of forming a pixel part having a photoelectric conversion part that photoelectrically converts incident light to obtain an electric signal, a vertical transistor that reads out signal charge from the photoelectric conversion part, and a planar transistor that processes the read out signal charge, and a peripheral circuit part having a first conductivity-type-channel transistor and a second conductivity-type-channel opposite to the first conductivity-type on a periphery of the pixel part on a semiconductor substrate, and the step of forming gate electrodes of the respective transistors of the pixel part and the peripheral circuit part includes the steps of forming a groove part in a region where the vertical transistor is formed on the semiconductor substrate, forming a gate insulator film on a surface of the semiconductor substrate containing an inner surface of the groove part, forming a first metal film or a first metal compound film on the semiconductor substrate containing the inner surface of the groove part in a region where the first conductivity-type-channel transistor is formed in a pixel part formation region where the pixel part is formed and in a peripheral circuit part formation region where the peripheral circuit part is formed via the gate insulator film, forming the second metal film or a second metal compound film having a work function different from that of the first metal film or the first metal compound film on the gate insulator film containing the first metal film or the first metal compound film, and forming a gate electrode of the vertical transistor, the gate electrode of the planar transistor of the pixel part, and the gate electrode of the first conductivity-type-channel transistor of the peripheral circuit part with the first metal film or the first metal compound film, and forming the gate electrode of the second conductivity-type-channel transistor of the peripheral circuit part with the second metal film or the second metal compound film.

In the fourth manufacturing method of a solid-state imaging device according to the embodiment of the invention, the first metal film or the first metal compound film formed on the inner surface of the groove part via the gate insulator film effectively functions as the gate electrode. Further, the gate electrode is formed by the filling layer of the second metal film or the second metal compound film filling the interior of the groove part and the second metal film or the second metal compound film connected to the first metal film or the first metal compound film. Therefore, it is not necessary to fill the groove part with the polysilicon film, and thus, it is not necessary to diffuse the impurity to the bottom of the groove part in the polysilicon filling the groove part by high-temperature heat treatment for forming the gate electrode unlike the technology in the past. Further, it is not necessary to perform ion implantation with high energy to allow the implanted ions to reach the bottom of the groove part in the polysilicon filling the groove part.

Further, the gate electrodes of the planar transistors of the pixel part and the peripheral circuit part are formed by the first metal film or the first metal compound film and the second metal film or the second metal compound film. For example, when the first conductivity-type is of the N-type and the second conductivity-type is of the P-type, the work function value of the second metal film or the second metal compound film is made larger than that of the first metal film or the first metal compound film. In addition, the gate electrode having a minute gate length can be formed.

An imaging apparatus according to an embodiment of the invention includes:

an imaging optical unit that collects incident light, a solid-state imaging device that receives and photoelectrically converts the light collected by the imaging optical unit, and a signal processing unit that processes a photoelectrically converted signal, wherein the solid-state imaging device includes a pixel part having a photoelectric conversion part that photoelectrically converts incident light to obtain signal charge and a peripheral circuit part formed on a periphery of the pixel part on a semiconductor substrate, the pixel part has a vertical transistor that reads out the signal charge from the photoelectric conversion part and a planar transistor that processes the signal charge read out by the vertical transistor, and the vertical transistor has a groove part formed on the semiconductor substrate;

a gate insulator film formed on an inner surface of the groove part, a conducting layer formed on a surface of the gate insulator film on the semiconductor substrate within and around the groove part, a filling layer filling an interior of the groove part via the gate insulator film and the conducting layer, and an electrode layer connected to the conducting layer on the filling layer.

Therefore, the solid-state imaging device according to the embodiment is applied to the imaging apparatus according to the embodiment.

In the solid-state imaging device according to the embodiment of the invention, the vertical transistor and the planar transistors having minute gate lengths are mounted on the same semiconductor substrate. Accordingly, there are advantages that the higher definition and higher density packaging of the transistors can be achieved and the higher definition and higher image processing speed can be realized.

In the manufacturing method of a solid-state imaging device according to the embodiment of the invention, the vertical transistor and the planar transistors having minute gate lengths are mounted on the same semiconductor substrate. Accordingly, there are advantages that the higher definition and higher density packaging of the transistors can be achieved and the higher definition and higher image processing speed can be realized.

In the imaging apparatus according to the embodiment of the invention, the solid-state imaging device according to the embodiment of the invention is used, and there is an advantage that the higher definition and higher image processing speed can be realized.

BRIEF DESCRIPTION OF THE DRAWINGS

FIG. 23 is a block diagram showing an example of a configuration of an imaging apparatus according to a ninth embodiment of the invention.

DESCRIPTION OF PREFERRED EMBODIMENTS

As below, best modes (hereinafter, referred to as embodiments) for implementing the invention will be described.

1. First Embodiment

First Example of Configuration of Solid-State Imaging Device

An example (the first example) of a configuration of a solid-state imaging device according to the first embodiment of the invention will be explained using a schematic configuration sectional view of FIG. 1.

Figure 1:
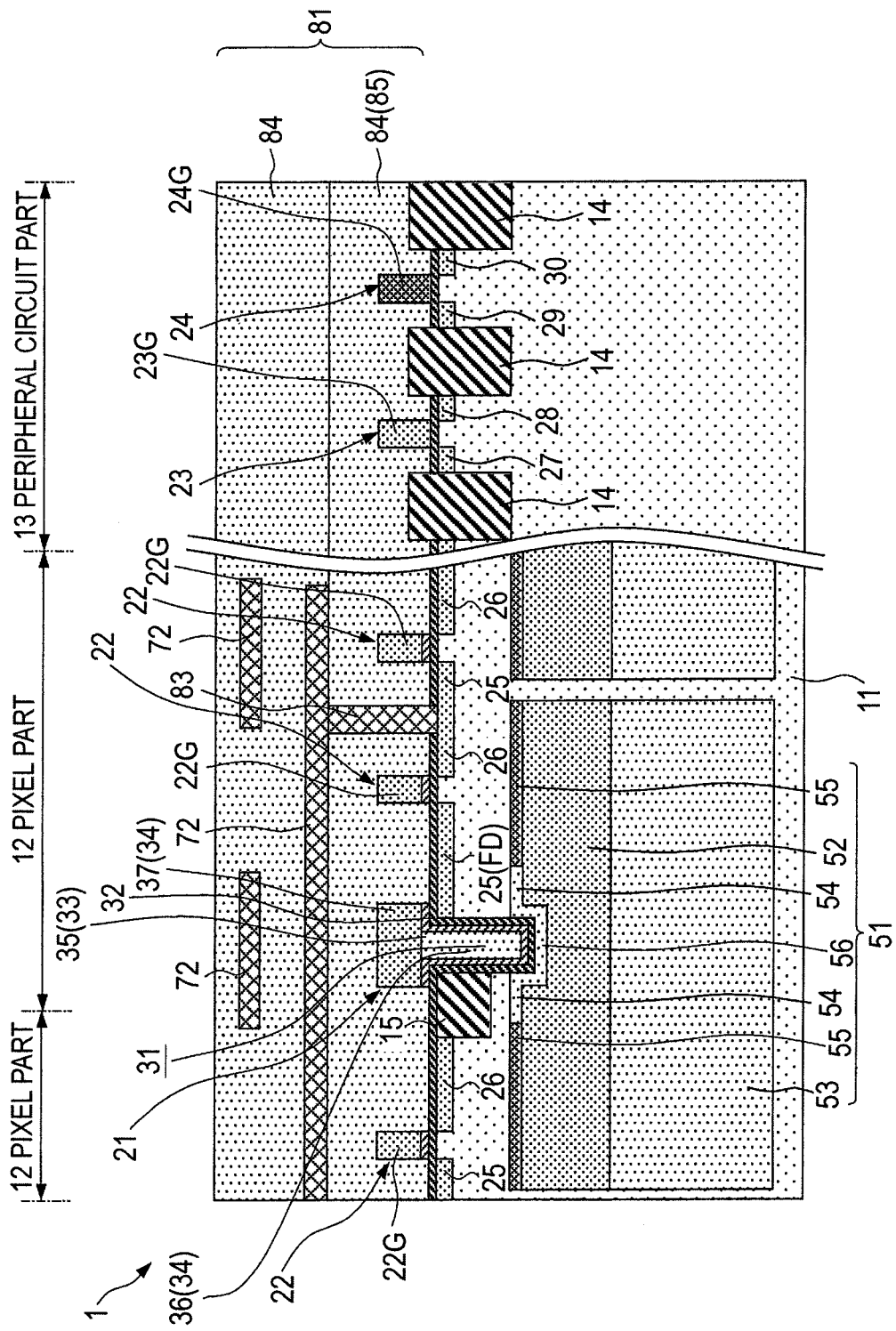
FIG. 1 is a schematic configuration sectional view showing an example of a configuration of a solid-state imaging device according to a first embodiment of the invention.

As shown in FIG. 1, in a semiconductor substrate 11, a photoelectric conversion part 51 that photoelectrically converts incident light to obtain an electric signal is formed. Further, in the semiconductor substrate 11, a pixel part 12 including a vertical transistor 21 that reads out signal charge from the photoelectric conversion part 51 and a planar transistor 22 that processes the read out signal charge is formed. Furthermore, a peripheral circuit part 13 is formed on the periphery of the pixel part 12. The peripheral circuit part 13 has a first conductivity-type (hereinafter, N-type, for example) channel transistor (hereinafter, referred to as NFET) 23, and a second conductivity-type (hereinafter, P-type, for example) channel transistor (hereinafter, referred to as PFET) 24.

As below, details of the configuration will be explained. As the semiconductor substrate 11, for example, a P-type semiconductor substrate is used.

The photoelectric conversion part 51 formed on the semiconductor substrate 11 includes a photodiode.

For example, an N-type semiconductor region (hereinafter, referred to as "high-density N-type region") 52 is formed at the surface side of the semiconductor substrate 11. Under the region, an N-type semiconductor region (hereinafter, referred to as "low-density N-type region") 53 at the lower density than that of the high-density N-type region 52 is formed in junction with the region. Furthermore, P-type semiconductor regions (hereinafter, referred to as "low-density P-type regions") 54 are formed on the high-density N-type region 52.

Around the low-density P-type regions 54, P-type semiconductor regions (hereinafter, referred to as "high-density P-type regions") 55 at the higher density than that of the low-density P-type regions 54 are formed.

Further, in the semiconductor substrate 11, the pixel parts 12, the peripheral circuit part 13, and first device isolation regions 14 that isolate the devices within the peripheral circuit part 13 are formed. In addition, a second device isolation region 15 that isolates the pixels is formed within the pixel part 12.

The first device isolation regions 14 are formed by typical STI (Shallow Trench Isolation), for example. Further, the second device isolation region 15 is formed by a P-type diffusion layer, for example.

More over, though not shown, well regions are formed in the region where the photoelectric conversion part 51 is formed, the region where the transistors of the pixel part 12 are formed, the region where the NFET 23 and the PFET 24 of the peripheral circuit part 13 are formed, and so on.

A groove part 31 is formed in the region where the gate electrode of the vertical transistor on the semiconductor substrate 11. The groove part 31 is formed to penetrate the low-density P-type regions 54 and reach the upper part of the high-density N-type region 52, and have a width of 0.1 μm to 0.4 μm, for example.

A gate insulator film 32 is formed on the inner surface of the groove part 31. The gate insulator film 32 is formed by surface-oxidizing the surface of the semiconductor substrate 11, for example.

Further, in the semiconductor substrate 11 at the bottom side of the groove part 31 and at the lower side thereof, a low-density P-type region 56 having nearly equal density to that of the low-density P-type regions 54 is formed.

On the inner surface of the groove part 31 and on the semiconductor substrate 11 around the part, a first polysilicon film 33 doped with a first conductivity-type impurity (e.g., an N-type impurity) is formed. The first polysilicon film 33 is formed to have a half thickness of the width of the groove part 31 so as not to fill the groove part 31 in a thickness of 30 nm or more, for example.

Further, a second polysilicon film 34 is formed to fill the groove part 31. Regarding the second polysilicon film 34, the part inside the groove part 31 is non-doped and the first conductivity-type impurity (e.g., N-type impurity) is doped on the groove part 31.

When the N-type impurity is doped, for example, phosphorus (P) or arsenic (As) is used. Further, when the first conductivity-type impurity is a P-type impurity, for example, boron (B) is used. The doping density doped in the first polysilicon film 33 is set to density at which the impurity density of $1 \times 10^{19}$ cm$^{-3}$ can be secured or higher even when the dopant diffuses in the entire polysilicon including the second polysilicon film 34 within the groove part 31.

Accordingly, the gate electrode 21G of the vertical transistor 21 includes a conducting layer 35 of the first polysilicon film 33 doped with the N-type impurity, a filling layer 36 of the second polysilicon film 34 of the non-doped part, and an electrode layer 37 of the second polysilicon film 34 doped with the N-type impurity in the groove part 31.

Further, on the semiconductor substrate 11 in the pixel part 12, plural planar transistors 22 are formed. For example, there are a reset transistor 22R, an amplification transistor 22A, a selection transistor (not shown). In the drawing, the reset transistor 22R and the amplification transistor 22A are shown.

In the planar transistor 22, for example, a gate electrode 22G is formed by a polysilicon film having the same layers as those of the first polysilicon film 33 and the second polysilicon film 34 via the gate insulator film 32 in the pixel part 12 of the semiconductor substrate 11. The polysilicon film is doped with the first conductivity-type impurity (e.g., the N-type impurity).

Furthermore, on the semiconductor substrate 11 of the peripheral circuit part 13, planar transistors NFET 23 and PFET 24 are formed.

In the NFET 23, for example, a gate electrode 23G is formed by a polysilicon film having the same layers as those of the second polysilicon film 34 via the gate insulator film 32 in the peripheral circuit part 13 of the semiconductor substrate 11. The polysilicon film is doped with the first conductivity-type impurity (e.g., the N-type impurity).

Further, in the PFET 24, for example, a gate electrode 24G is formed by a polysilicon film having the same layers as those of the second polysilicon film 34 via the gate insulator film 32 in the peripheral circuit part 13 of the semiconductor substrate 11. The polysilicon film is doped with the second conductivity-type impurity (e.g., the P-type impurity).

On the semiconductor substrate 11 on both sides of the gate electrode 22G of the planar transistor 22, source and drain regions 25, 26 are formed.

Here, for example, the source and drain region 26 of the reset transistor 22R and the source and drain region 25 of the amplification transistor 22A are formed by a common diffusion layer. Further, the source and drain region 26 of the amplification transistor 22A and the source and drain region (not shown) of the selection transistor (not shown) are formed by a common diffusion layer.

Furthermore, the source and drain region 25 of the reset transistor 22R at the vertical transistor side and the source and drain region of the vertical transistor 21 are common. The common diffusion layer is a floating diffusion FD.

In addition, these diffusion layers may be common or connected using metal wiring.

Therefore, the vertical transistor 21 is a transfer transistor that reads out the signal charge photoelectrically converted by the photoelectric conversion part 51.

On the other hand, on the semiconductor substrate 11 on both sides of the gate electrode 23G of the planar transistor 23 in the peripheral circuit part 13, source and drain regions 27, 28 are formed.

Further, on the semiconductor substrate 11 on both sides of the gate electrode 24G of the planar transistor 24, source and drain regions 29, 30 are formed.

Note that, in the source and drain regions 25 to 30 of the planar transistors 22 to 24, extension regions (not shown) may be formed according to need.

Further, on the semiconductor substrate 11, a wiring layer 81 is formed. For example, the wiring layer 81 includes plural layers of wires 82, plugs 83 connecting between the wires, and an insulator film 84 covering the wires 82. The insulator film 84 is formed in plural layers, and the lowermost insulator film 85 covers the respective gate electrodes 21G to 24G. Furthermore, the plural layers of wires 82 are formed in two layers in the drawing, however, the number of layers may be three, four, or more according to need.

In addition, a support substrate (not shown) is formed at the wiring layer 81 side. The side of the semiconductor substrate 11 at which the photoelectric conversion part 51 is formed is formed to have a desired thickness, and a color filter layer, a collector lens (microlens), etc. are formed thereon.

As described above, a solid-state imaging device 1 is configured.

In the solid-state imaging device 1 according to the embodiment of the invention, inside the groove part 31, the conducting layer 35 formed via the gate insulator film 32 on the inner surface thereof, the filling layer 36 filing the interior of the groove part 31, and the gate electrode 21G formed by the electrode layer 37 connected to the conducting layer 35 are formed. Effectively, the conducting layer 35 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode unlike the technology in the past. Further, it is not necessary to perform ion implantation with high energy to allow the implanted ions to reach the bottom of the groove part 31 in the polysilicon filling the groove part 31.

Therefore, the vertical transistor 21 can be configured and the vertical transistor and the planar transistors having minute gate lengths are mounted on the same semiconductor substrate. Accordingly, there are advantages that the higher definition and higher density packaging of the transistors can be achieved and the higher definition and higher image processing speed can be realized.

2. Second Embodiment

Second Example of Configuration of Solid-State Imaging Device

An example (the second example) of a configuration of a solid-state imaging device according to the second embodiment of the invention will be explained using a schematic configuration sectional view of FIG. 2.

Figure 2:
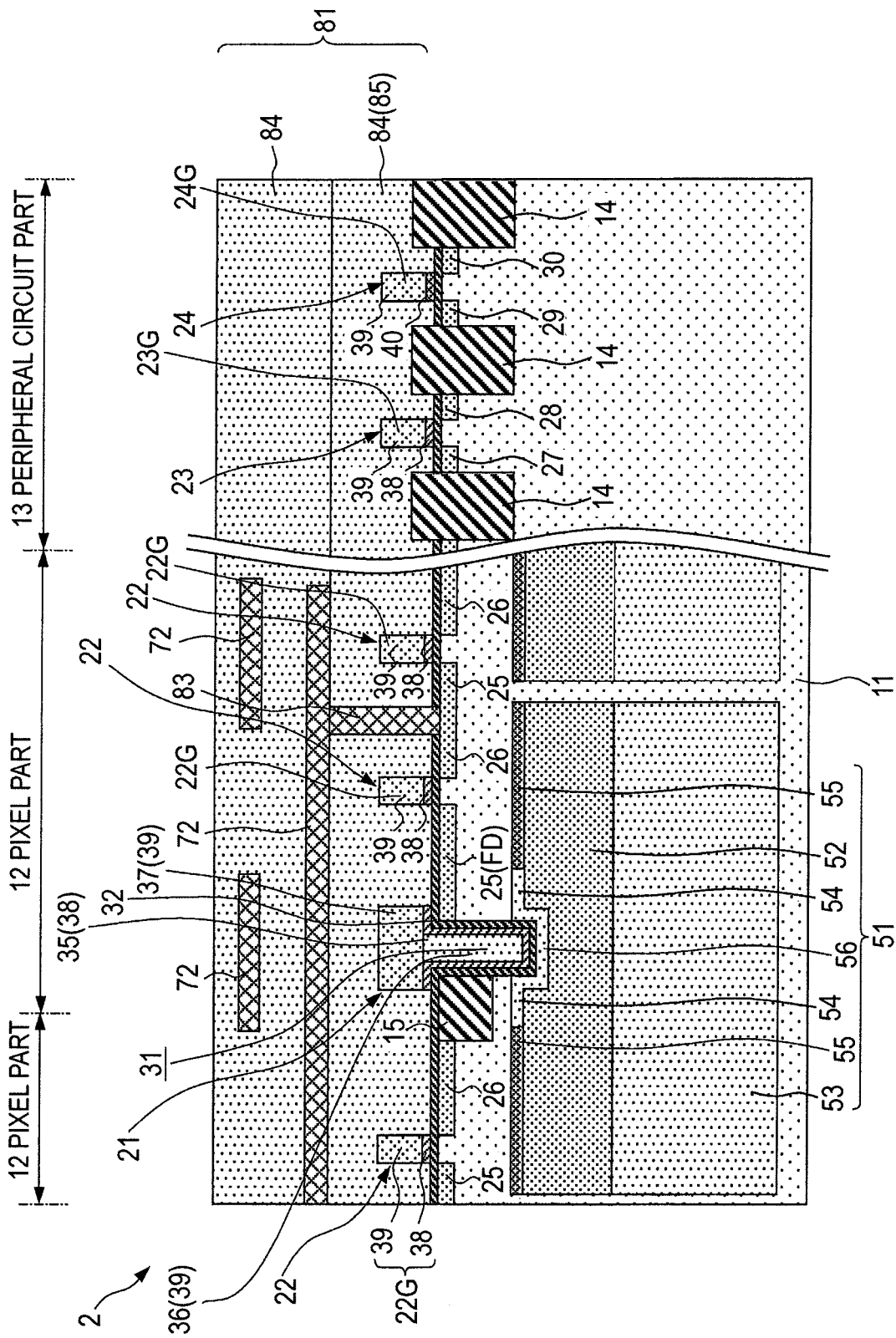
FIG. 2 is a schematic configuration sectional view showing an example of a configuration of a solid-state imaging device according to a second embodiment of the invention.

As shown in FIG. 2, in a semiconductor substrate 11, a photoelectric conversion part 51 that photoelectrically converts incident light to obtain an electric signal is formed. Further, in the semiconductor substrate 11, a pixel part 12 including a vertical transistor 21 that reads out signal charge from the photoelectric conversion part 51 and a planar transistor 22 that processes the read out signal charge is formed. Furthermore, a peripheral circuit part 13 is formed on the periphery of the pixel part 12. The peripheral circuit part 13 has a first conductivity-type (hereinafter, N-type, for example) channel transistor (hereinafter, referred to as NFET) 23, and a second conductivity-type (hereinafter, P-type, for example) channel transistor (hereinafter, referred to as PFET) 24.

As below, details of the configuration will be explained. As the semiconductor substrate 11, for example, a P-type semiconductor substrate is used.

The photoelectric conversion part 51 formed on the semiconductor substrate 11 includes a photodiode.

For example, an N-type semiconductor region (hereinafter, referred to as "high-density N-type region") 52 is formed at the surface side of the semiconductor substrate 11. Under the region, an N-type semiconductor region (hereinafter, referred to as "low-density N-type region") 53 at the lower density than that of the high-density N-type region 52 is formed in junction with the region. Furthermore, P-type semiconductor regions (hereinafter, referred to as "low-density P-type regions") 54 are formed on the high-density N-type region 52.

Around the low-density P-type regions 54, P-type semiconductor regions (hereinafter, referred to as "high-density P-type regions") 55 at the higher density than that of the low-density P-type regions 54 are formed.

Further, in the semiconductor substrate 11, the pixel parts 12, the peripheral circuit part 13, and first device isolation regions 14 that isolate the devices within the peripheral circuit part 13 are formed. In addition, a second device isolation region 15 that isolates the pixels is formed within the pixel part 12.

The first device isolation regions 14 are formed by typical STI (Shallow Trench Isolation), for example. Further, the second device isolation region 15 is formed by a P-type diffusion layer, for example.

More over, though not shown, well regions are formed in the regions where the photoelectric conversion parts 51 are formed, the regions where the transistors of the pixel part 12 are formed, the regions where the NFET 23 and the PFET 24 of the peripheral circuit part 13 are formed, and so on.

A groove part 31 is formed in the region where the gate electrode of the vertical transistor on the semiconductor substrate 11. The groove part 31 is formed to penetrate the low-density P-type regions 54 and reach the upper part of the high-density N-type region 52, and have a width of 0.1 µm to 0.4 µm, for example.

A gate insulator film 32 is formed on the inner surface of the groove part 31. The gate insulator film 32 is formed by surface-oxidizing the surface of the semiconductor substrate 11, for example.

Further, in the semiconductor substrate 11 at the bottom side of the groove part 31 and at the lower side thereof, a low-density P-type region 56 having nearly equal density to that of the low-density P-type regions 54 is formed.

On the inner surface of the groove part 31 and on the semiconductor substrate 11 around the part, a conducting layer including a polysilicon film 38 doped with a first conductivity-type impurity (e.g., an N-type impurity) is formed. The conducting layer 35 is formed to have a half thickness of the width of the groove part 31 so as not to fill the groove part 31 in a thickness of 30 nm or more, for example.

When the N-type impurity is doped, for example, phosphorus (P) or arsenic (As) is used. Further, when the first conductivity-type impurity is a P-type impurity, for example, boron (B) is used. The doping density doped in the polysilicon film 38 is set to density at which the impurity density of $1 \times 10^{19}$ cm$^{-3}$ can be secured or higher.

Further, a metal (or a metal compound) film 39 is formed to fill the groove part 31. For the metal film, for example, a metal such as tungsten or nickel may be used. For the metal compound film, for example, a metal nitride such as tungsten nitride or titanium nitride, or a metal silicide such as nickel silicide or cobalt silicide may be used.

Accordingly, the gate electrode 21G of the vertical transistor 21 includes the conducting layer 35, the filling layer 36 of the metal (or the metal compound) film 39, and an electrode layer 37.

Further, on the semiconductor substrate 11 in the pixel part 12, plural planar transistors 22 are formed. For example, there are a reset transistor 22R, an amplification transistor 22A, a selection transistor (not shown). In the drawing, the reset transistor 22R and the amplification transistor 22A are shown.

In the planar transistor 22, for example, a gate electrode 22G is formed by a polysilicon film 38 having the same layers as those of the polysilicon film 38 and a metal (or a metal compound) film 39 having the same layers as those of the metal (or the metal compound) film 39 via the gate insulator film 32 in the pixel part 12 of the semiconductor substrate 11. The polysilicon film 38 is doped with the first conductivity-type impurity (e.g., the N-type impurity).

Furthermore, on the semiconductor substrate 11 of the peripheral circuit part 13, an NFET 23 and a PFET 24 of planar transistors are formed.

In the NFET 23, for example, a gate electrode 23G is formed by a polysilicon film 38 having the same layers as those of the polysilicon film 38 and a metal (or a metal compound) film 39 having the same layers as those of the metal (or the metal compound) film 39 via the gate insulator film 32 in the peripheral circuit part 13 of the semiconductor substrate 11. The polysilicon film is doped with the first conductivity-type impurity (e.g., the N-type impurity).

Further, in the PFET 24, for example, a gate electrode 24G is formed by a polysilicon film 40 having the same layers as those of the polysilicon film 38 and doped with the second conductivity-type impurity (e.g., the P-type impurity) and a metal (or a metal compound) film 39 having the same layers as those of the metal (or the metal compound) film 39 via the gate insulator film 32 in the peripheral circuit part 13 of the semiconductor substrate 11.

On the semiconductor substrate 11 on both sides of the gate electrode 22G of the planar transistor 22, source and drain regions 25, 26 are formed.

Here, for example, the source and drain region 26 of the reset transistor 22R and the source and drain region 25 of the amplification transistor 22A are formed by a common diffusion layer. Further, the source and drain region 26 of the amplification transistor 22A and the source and drain region (not shown) of the selection transistor (not shown) are formed by a common diffusion layer.

Furthermore, the source and drain region 25 of the reset transistor 22R at the vertical transistor side and the source and drain region of the vertical transistor 21 are common. The common diffusion layer is a floating diffusion FD.

In addition, these diffusion layers may be common or connected using metal wiring.

Therefore, the vertical transistor 21 is a transfer transistor that reads out the signal charge photoelectrically converted by the photoelectric conversion part 51.

On the other hand, on the semiconductor substrate 11 on both sides of the gate electrode 23G of the planar transistor NFET 23 in the peripheral circuit part 13, source and drain regions 27, 28 are formed.

Further, on the semiconductor substrate 11 on both sides of the gate electrode 24G of the planar transistor PFET 24, source and drain regions 29, 30 are formed.

Note that, in the source and drain regions 25 to 30 of the planar transistors 22, NFET 23, PFET 24, extension regions (not shown) may be formed according to need.

Further, on the semiconductor substrate 11, a wiring layer 81 is formed. For example, the wiring layer 81 includes plural layers of wires 82, plugs 83 connecting between the wires, and an insulator film 84 covering the wires 82. The insulator film 84 is formed in plural layers, and the lowermost insulator film 85 covers the respective gate electrodes 21G to 24G. Furthermore, the plural layers of wires 82 are formed in two layers in the drawing, however, the number of layers may be three, four, or more according to need.

In addition, a support substrate (not shown) is formed at the wiring layer 81 side. The side of the semiconductor substrate 11 at which the photoelectric conversion part 51 is formed is formed to have a desired thickness, and a color filter layer, a collector lens (microlens), etc. are formed thereon.

As described above, a solid-state imaging device 2 is configured.

In the solid-state imaging device 2 according to the embodiment of the invention, inside the groove part 31, the conducting layer 35 formed via the gate insulator film 32 on the inner surface thereof, the filling layer 36 filing the interior of the groove part 31, and the gate electrode 21G formed by the electrode layer 37 connected to the conducting layer 35 are formed. Effectively, the conducting layer 35 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode unlike the technology in the past. Further, it is not necessary to perform ion implantation with high energy to allow the implanted ions to reach the bottom of the groove part 31 in the polysilicon filling the groove part 31.

Therefore, the vertical transistor 21 can be configured and the vertical transistor and the planar transistors 22, NFET 23, PFET 24 having minute gate lengths are mounted on the same semiconductor substrate 11. Accordingly, there are advantages that the higher definition and higher density packaging of the transistors can be achieved and the higher definition and higher image processing speed can be realized.

3. Third Embodiment

Third Example of Configuration of Solid-State Imaging Device

An example (the third example) of a configuration of a solid-state imaging device according to the third embodiment of the invention will be explained using a schematic configuration sectional view of FIG. 3.

Figure 3:
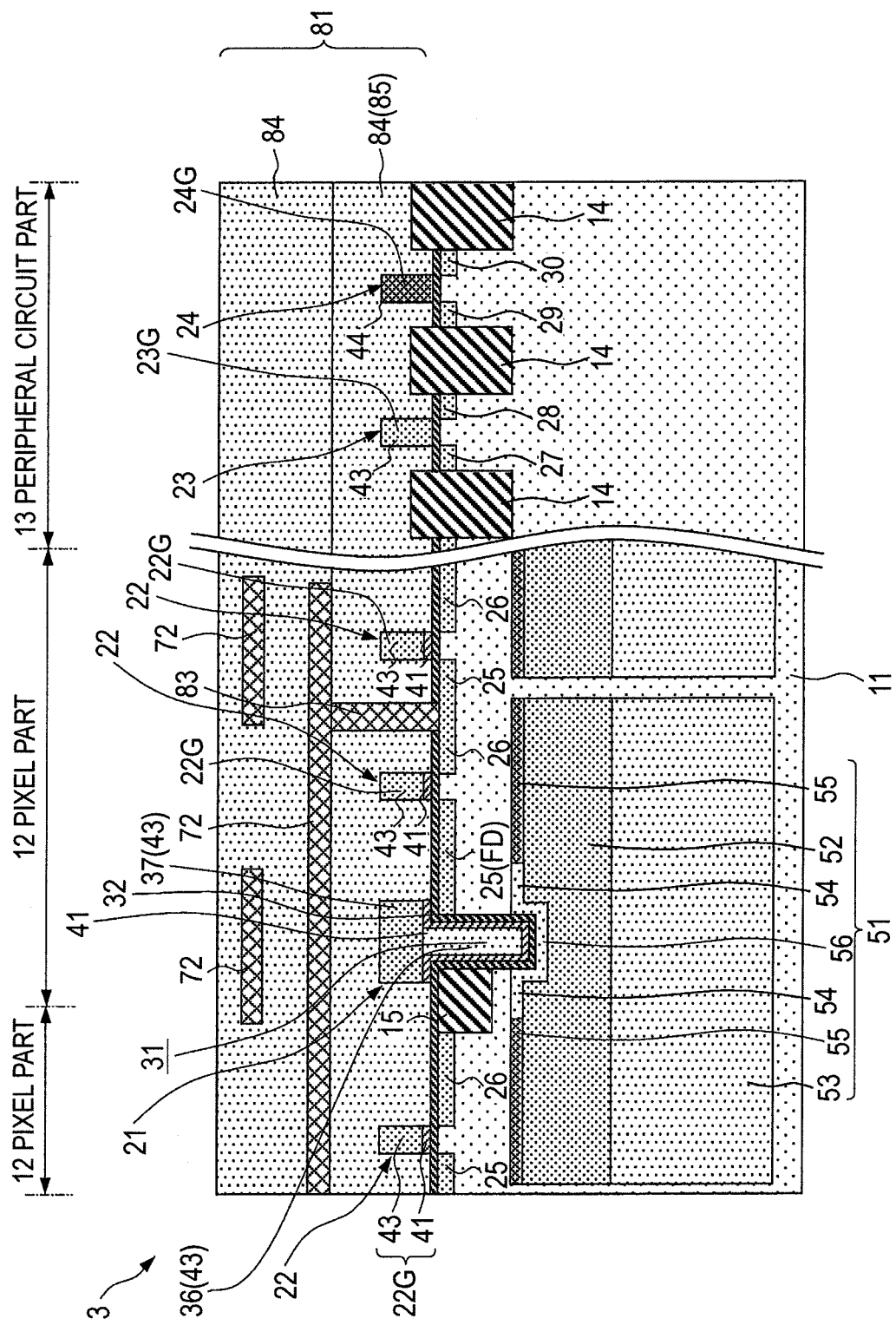
FIG. 3 is a schematic configuration sectional view showing an example of a configuration of a solid-state imaging device according to a third embodiment of the invention.

As shown in FIG. 3, in a semiconductor substrate 11, a photoelectric conversion part 51 that photoelectrically converts incident light to obtain an electric signal is formed. Further, in the semiconductor substrate 11, a pixel part 12 including a vertical transistor 21 that reads out signal charge from the photoelectric conversion part 51 and a planar transistor that processes the read out signal charge is formed. Furthermore, a peripheral circuit part 13 is formed around on the periphery of the pixel part 12. The peripheral circuit part 13 has a first conductivity-type (hereinafter, N-type, for example) channel transistor (hereinafter, referred to as NFET) 23, and a second conductivity-type (hereinafter, P-type, for example) channel transistor (hereinafter, referred to as PFET) 24.

As below, details of the configuration will be explained. As the semiconductor substrate 11, for example, a P-type semiconductor substrate is used.

The photoelectric conversion part 51 formed on the semiconductor substrate 11 includes a photodiode.

For example, an N-type semiconductor region (hereinafter, referred to as "high-density N-type region") 52 is formed at the surface side of the semiconductor substrate 11. Under the region, an N-type semiconductor region (hereinafter, referred to as "low-density N-type region") 53 at the lower density than that of the high-density N-type region 52 is formed in junction with the region. Furthermore, P-type semiconductor regions (hereinafter, referred to as "low-density P-type regions") 54 are formed on the high-density N-type region 52.

Around the low-density P-type regions 54, P-type semiconductor regions (hereinafter, referred to as "high-density P-type regions") 55 at the higher density than that of the low-density P-type regions 54 are formed.

Further, in the semiconductor substrate 11, the pixel parts 12, the peripheral circuit part 13, and first device isolation regions 14 that isolate the devices within the peripheral circuit part 13 are formed. In addition, a second device isolation region 15 that isolates the pixels is formed within the pixel part 12.

The first device isolation regions 14 are formed by typical STI (Shallow Trench Isolation), for example. Further, the second device isolation region 15 is formed by a P-type diffusion layer, for example.

More over, though not shown, well regions are formed in the regions where the photoelectric conversion parts 51 are formed, the regions where the planar transistors of the pixel part 12 are formed, the regions where the planar transistors NFET 23 and PFET 24 of the peripheral circuit part 13 are formed, and so on.

A groove part 31 is formed in the region where the gate electrode of the vertical transistor on the semiconductor substrate 11. The groove part 31 is formed to penetrate the low-density P-type regions 54 and reach the upper part of the high-density N-type region 52, and have a width of 0.1 μm to 0.4 μm, for example. A gate insulator film 32 is formed on the inner surface of the groove part 31. The gate insulator film 32 is formed by surface-oxidizing the surface of the semiconductor substrate 11, for example.

Alternatively, as the gate insulator film 32, a film including an oxide, silicate, nitrided oxide, or oxidized nitrided silicate containing at least one kind selected from silicon (Si), aluminum (Al), yttrium (Y), zirconium (Zr), lanthanum (La), hafnium (Hf), and tantalum (Ta) may be used.

Specifically, silicon oxide ($SiO_2$), hafnium oxide ($HfO_2$), zirconium oxide ($ZrO_2$), lanthanum oxide ($La_2O_3$), yttrium oxide ($Y_2O_3$), tantalum oxide ($Ta_2O_3$), aluminum oxide ($Al_2O_3$), hafnium silicate ($HfSiO_x$), zirconium silicate ($ZrSiO_x$), zirconium titanate ($ZrTiO_x$), hafnium aluminum oxide ($HfAlO_x$), zirconium aluminum oxide ($ZrAlO_x$), and further, nitride of them (silicon oxynitride (SiON), hafnium silicide oxynitride (HfSiON), etc.) are cited. The relative permittivity of these materials may slightly vary depending on composition and crystalline property. For example, the relative permittivity of $HfO_2$ is 25 to 30, and the relative permittivity of $ZrO_2$ is 20 to 25.

Further, in the semiconductor substrate 11 at the bottom side of the groove part 31 and at the lower side thereof, a low-density P-type region 56 having nearly equal density to that of the low-density P-type regions 54 is formed.

On the inner surface of the groove part 31 and on the semiconductor substrate 11 around the part, a conducting layer 35 including a metal film or metal compound film 41 is formed via the gate insulator film 32. For the metal film, for example, hafnium (Hf) or lanthanoid metal is used, and the film is formed to have a thickness from 5 nm to 30 nm so as not to fill the groove part 31. As the metal compound film, for example, hafnium silicide or silicide of lanthanoid metal is used, and the film is formed to have a thickness from 5 nm to 30 nm so as not to fill the groove part 31.

Note that, a film that controls a work function may be used for the conducting layer 35.

For example, in the case of NFET, its gate electrode has a work function less than 4.6 eV, desirably equal to less than 4.3 eV. In the case of PFET, its gate electrode has a work function equal to or more than 4.6 eV, desirably equal to more than 4.9 eV.

For example, an example of the work-function control film, there are metals of titanium (Ti), vanadium (V), nickel (Ni), zirconium (Zr), niobium (Nb), molybdenum (Mo), ruthenium (Ru), Hafnium (Hf), tantalum (Ta), tungsten (W), platinum (Pt), alloys containing these metals, and compounds of these metals. As the metal compounds, there are metal nitrides and compounds of metal and semiconductor. The compounds of metal and semiconductor include a metal silicate as an example.

As an example of the work-function control film suitable for NFET, there are metals such as hafnium (Hf) and tantalum (Ta), and alloys containing these metals, and compounds of these metals, and specifically, hafnium silicate ($HfSi_x$) is more preferable. The hafnium silicate for nMOSFET has a work function of about 4.1 eV to 4.3 eV.

As an example of the work-function control film suitable for PFET, there are metals such as titanium (Ti), molybdenum (Mo), and ruthenium (Ru) and alloys containing these metals, and compounds of these metals. Specifically, titanium nitride (TiN) or ruthenium (Ru) is more preferable. The titanium nitride for pMOSFET has a work function of about 4.5 eV to 5.0 eV.

Further, a polysilicon film 42 is formed to fill the groove part 31. Regarding the polysilicon film 42, the part inside the groove part 31 is a non-doped polysilicon film 42 and the part on the groove part 31 is a polysilicon film 43 doped with the first conductivity-type impurity (e.g., N-type impurity).

When the N-type impurity is doped, for example, phosphorus (P) or arsenic (As) is used. Further, when the first conductivity-type impurity is a P-type impurity, for example, boron (B) is used. The doping density doped in the polysilicon film 43 is set to density at which the impurity density of $1 \times 10^{19}$ $cm^{-3}$ can be secured or higher even when the dopant diffuses in the entire polysilicon including the polysilicon film 42 within the groove part 31.

Accordingly, the gate electrode 21G of the vertical transistor 21 includes the conducting layer 35 including the metal film or the metal compound film 41, a filling layer 36 of the polysilicon film 42 of the non-doped part, and an electrode layer 37 of the polysilicon film 43 doped with the N-type impurity in the groove part 31.

Further, on the semiconductor substrate 11 in the pixel part 12, plural planar transistors 22 are formed. For example, there are a reset transistor 22R, an amplification transistor 22A, a selection transistor (not shown). In the drawing, the reset transistor 22R and the amplification transistor 22A are shown.

In the planar transistor 22, for example, a gate electrode 22G is formed by a polysilicon film having the same layers as those of the conducting layer 35 and the polysilicon film 42 via the gate insulator film 32 in the pixel part 12 of the semiconductor substrate 11. The polysilicon film is doped with the first conductivity-type impurity (e.g., the N-type impurity).

Furthermore, on the semiconductor substrate 11 of the peripheral circuit part 13, planar transistors NFET 23 and PFET 24 are formed.

In the NFET 23, for example, a gate electrode 23G is formed by a polysilicon film having the same layers as those of the polysilicon film 42 via the gate insulator film 32 in the peripheral circuit part 13 of the semiconductor substrate 11.

The polysilicon film is doped with the first conductivity-type impurity (e.g., the N-type impurity).

Further, in the PFET 24, for example, a gate electrode 24G is formed by a polysilicon film 44 doped with the second conductivity-type impurity (e.g., the P-type impurity) via the gate insulator film 32 in the peripheral circuit part 13 of the semiconductor substrate 11.

On the semiconductor substrate 11 on both sides of the gate electrode 22G of the planar transistor 22, source and drain regions 25, 26 are formed.

Here, for example, the source and drain region 26 of the reset transistor 22R and the source and drain region 25 of the amplification transistor 22A are formed by a common diffusion layer. Further, the source and drain region 26 of the amplification transistor 22A and the source and drain region (not shown) of the selection transistor (not shown) are formed by a common diffusion layer.

Furthermore, the source and drain region 25 of the reset transistor 22R at the vertical transistor side and the source and drain region of the vertical transistor 21 are common. The common diffusion layer is a floating diffusion FD.

In addition, these diffusion layers may be common or connected using metal wiring.

Therefore, the vertical transistor 21 is a transfer transistor that reads out the signal charge photoelectrically converted by the photoelectric conversion part 51.

On the other hand, on the semiconductor substrate 11 on both sides of the gate electrode 23G of the planar transistor 23 in the peripheral circuit part 13, source and drain regions 27, 28 are formed.

Further, on the semiconductor substrate 11 on both sides of the gate electrode 24G of the planar transistor 24, source and drain regions 29, 30 are formed.

Note that, in the source and drain regions 25 to 30 of the planar transistors 22 to 24, extension regions (not shown) may be formed according to need.

Further, on the semiconductor substrate 11, a wiring layer 81 is formed. For example, the wiring layer 81 includes plural layers of wires 82, plugs 83 connecting between the wires, and an insulator film 84 covering the wires 82. The insulator film 84 is formed in plural layers, and the lowermost insulator film 85 covers the respective gate electrodes 21G to 24G. Furthermore, the plural layers of wires 82 are formed in two layers in the drawing, however, the number of layers may be three, four, or more according to need.

In addition, a support substrate (not shown) is formed at the wiring layer 81 side. The side of the semiconductor substrate 11 at which the photoelectric conversion part 51 is formed is formed to have a desired thickness, and a color filter layer, a collector lens (microlens), etc. are formed thereon.

As described above, a solid-state imaging device 3 is configured.

In the solid-state imaging device 3 according to the embodiment of the invention, inside the groove part 31, the conducting layer 35 formed via the gate insulator film 32 on the inner surface thereof, the filling layer 36 filing the interior of the groove part 31, and the gate electrode 21G formed by the electrode layer 37 connected to the conducting layer 35 are formed. Effectively, the conducting layer 35 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode unlike the technology in the past. Further, it is not necessary to perform ion implantation with high energy to allow the implanted ions to reach the bottom of the groove part 31 in the polysilicon filling the groove part 31.

Therefore, the vertical transistor 21 can be configured and the vertical transistor and the planar transistors 22, NFET 23, PFET 24 having minute gate lengths are mounted on the same semiconductor substrate 11. Accordingly, there are advantages that the higher definition and higher density packaging of the transistors can be achieved and the higher definition and higher image processing speed can be realized.

4. Fourth Embodiment

Fourth Example of Configuration of Solid-State Imaging Device

An example (the fourth example) of a configuration of a solid-state imaging device according to the fourth embodiment of the invention will be explained using a schematic configuration sectional view of FIG. 4.

Figure 4:
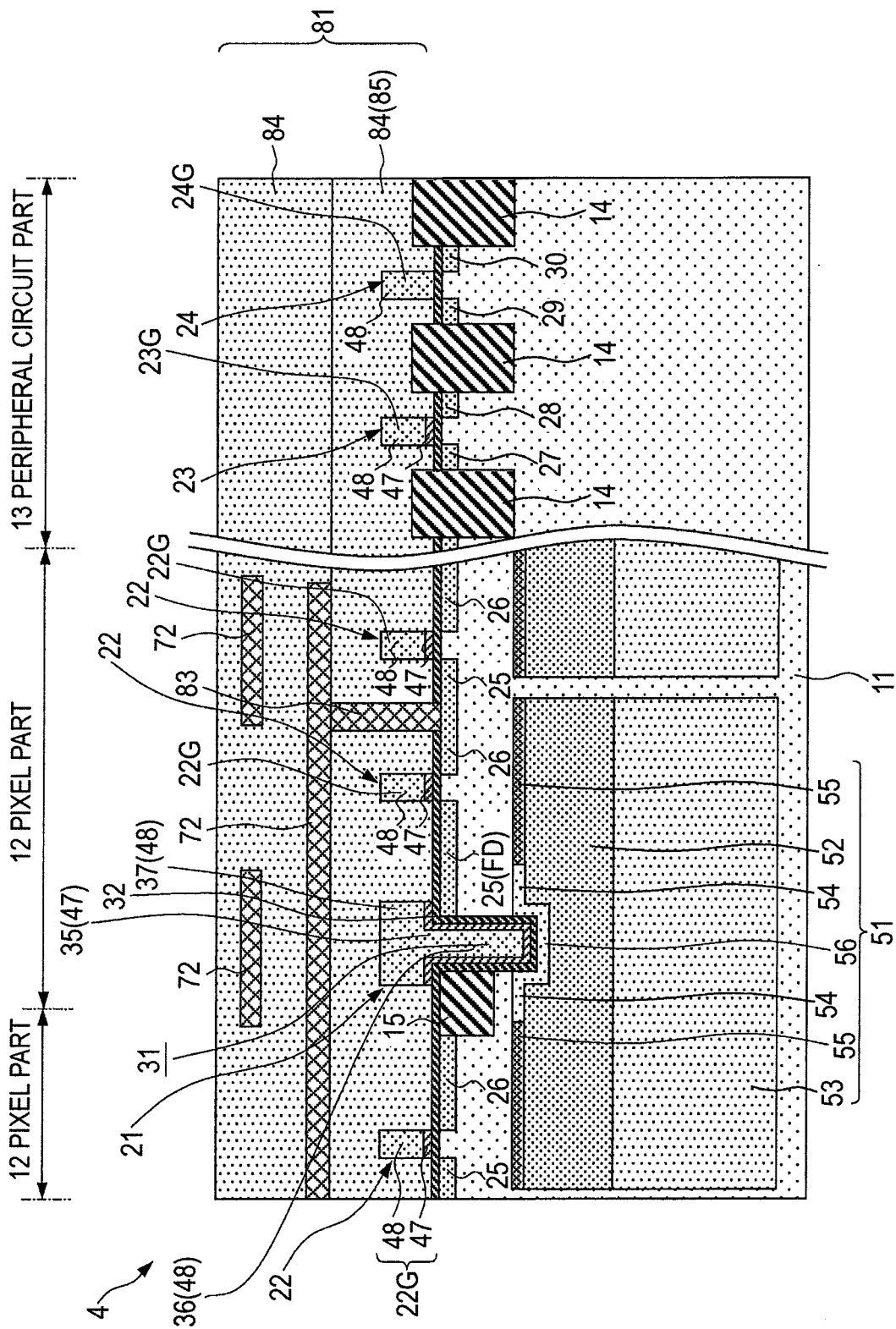
FIG. 4 is a schematic configuration sectional view showing an example of a configuration of a solid-state imaging device according to a fourth embodiment of the invention.

As shown in FIG. 4, in a semiconductor substrate 11, a photoelectric conversion part 51 that photoelectrically converts incident light to obtain an electric signal is formed. Further, in the semiconductor substrate 11, a pixel part 12 including a vertical transistor 21 that reads out signal charge from the photoelectric conversion part 51 and a planar transistor that processes the read out signal charge is formed. Furthermore, a peripheral circuit part 13 is formed around on the periphery of the pixel part 12. The peripheral circuit part 13 has a first conductivity-type (hereinafter, N-type, for example) channel transistor (hereinafter, referred to as NFET) 23, and a second conductivity-type (hereinafter, P-type, for example) channel transistor (hereinafter, referred to as PFET) 24.

As below, details of the configuration will be explained. As the semiconductor substrate 11, for example, a P-type semiconductor substrate is used.

The photoelectric conversion part 51 formed on the semiconductor substrate 11 includes a photodiode.

For example, an N-type semiconductor region (hereinafter, referred to as "high-density N-type region") 52 is formed at the surface side of the semiconductor substrate 11. Under the region, an N-type semiconductor region (hereinafter, referred to as "low-density N-type region") 53 at the lower density than that of the high-density N-type region 52 is formed in junction with the region. Furthermore, P-type semiconductor regions (hereinafter, referred to as "low-density P-type regions") 54 are formed on the high-density N-type region 52.

Around the low-density P-type regions 54, P-type semiconductor regions (hereinafter, referred to as "high-density P-type regions") 55 at the higher density than that of the low-density P-type regions 54 are formed.

Further, in the semiconductor substrate 11, the pixel parts 12, the peripheral circuit part 13, and first device isolation regions 14 that isolate the devices within the peripheral circuit part 13 are formed. In addition, a second device isolation region 15 that isolates the pixels is formed within the pixel part 12.

The first device isolation regions 14 are formed by typical STI (Shallow Trench Isolation), for example. Further, the second device isolation region 15 is formed by a P-type diffusion layer, for example.

More over, though not shown, well regions are formed in the regions where the photoelectric conversion parts 51 are formed, the regions where the transistors of the pixel part 12 are formed, the regions where the NFET 23 and the PFET 24 of the peripheral circuit part 13 are formed, and so on.

A groove part 31 is formed in the region where the gate electrode of the vertical transistor on the semiconductor substrate 11. The groove part 31 is formed to penetrate the low-density P-type regions 54 and reach the upper part of the high-density N-type region 52, and have a width of 0.1 μm to 0.2 μm, for example.

A gate insulator film 32 is formed on the inner surface of the groove part 31. The gate insulator film 32 is formed by surface-oxidizing the surface of the semiconductor substrate 11, for example.

Alternatively, as the gate insulator film 32, a film including an oxide, silicate, nitrided oxide, or oxidized nitrided silicate containing at least one kind selected from silicon (Si), aluminum (Al), yttrium (Y), zirconium (Zr), lanthanum (La), hafnium (Hf), and tantalum (Ta) may be used.

Specifically, silicon oxide ($SiO_2$), hafnium oxide ($HfO_2$), zirconium oxide ($ZrO_2$), lanthanum oxide ($La_2O_3$), yttrium oxide ($Y_2O_3$), tantalum oxide ($Ta_2O_5$), aluminum oxide ($Al_2O_3$), hafnium silicate ($HfSiO_x$), zirconium silicate ($ZrSiO_x$), zirconium titanate ($ZrTiO_x$), hafnium aluminum oxide ($HfAlO_x$), zirconium aluminum oxide ($ZrAlO_x$), and further, nitride of them (silicon oxynitride (SiON), hafnium silicide oxynitride (HfSiON), etc.) are cited. The relative permittivity of these materials may slightly vary depending on composition and crystalline property. For example, the relative permittivity of $HfO_2$ is 25 to 30, and the relative permittivity of $ZrO_2$ is 20 to 25.

Further, in the semiconductor substrate 11 at the bottom side of the groove part 31 and at the lower side thereof, a low-density P-type region 56 having nearly equal density to that of the low-density P-type regions 54 is formed.

On the inner surface of the groove part 31 and on the semiconductor substrate 11 around the part, a first conducting layer 47 including a metal film or metal compound film is formed via the gate insulator film 32. For the metal film, for example, hafnium (Hf) or lanthanoid metal is used, and the film is formed to have a thickness from 5 nm to 30 nm so as not to fill the groove part 31. As the metal compound film, for example, hafnium silicide or silicide of lanthanoid metal is used, and the film is formed to have a thickness from 5 nm to 30 nm so as not to fill the groove part 31.

Further, a film that controls a work function may be used for the first conducting layer 47.

For example, in the case of NFET, its gate electrode has a work function less than 4.6 eV, desirably equal to less than 4.3 eV. In the case of PFET, its gate electrode has a work function equal to or more than 4.6 eV, desirably equal to more than 4.9 eV.

For example, an example of the work-function control film, there are metals of titanium (Ti), vanadium (V), nickel (Ni), zirconium (Zr), niobium (Nb), molybdenum (Mo), ruthenium (Ru), hafnium (Hf), tantalum (Ta), tungsten (W), platinum (Pt), alloys containing these metals, and compounds of these metals. As the metal compounds, there are metal nitrides and compounds of metal and semiconductor. The compounds of metal and semiconductor include a metal silicate as an example.

As an example of the work-function control film suitable for NFET, there are metals such as hafnium (Hf) and tantalum (Ta), and alloys containing these metals, and compounds of these metals, and specifically, hafnium silicate ($HfSi_x$) is more preferable. The hafnium silicate for nMOSFET has a work function of about 4.1 eV to 4.3 eV.

As an example of the work-function control film suitable for PFET, there are metals such as titanium (Ti), molybdenum (Mo), and ruthenium (Ru) and alloys containing these metals, and compounds of these metals. Specifically, titanium nitride (TiN) or ruthenium (Ru) is more preferable. The titanium nitride for pMOSFET has a work function of about 4.5 eV to 5.0 eV.

The first conducting layer 47 has the gate electrode of NFET, and a work-function control film suitable for NFET is used therefor.

Further, a second conducting layer 48 including a metal layer or a metal compound layer is formed on the first conducting layer 47 to fill the groove part 31.

Accordingly, the gate electrode 21G of the vertical transistor 21 includes the conducting layer 35 of the first conducting layer 47, a filling layer 36 of the second conducting layer 48, and an electrode layer 37 of the second conducting layer 48 in the groove part 31.

Further, on the semiconductor substrate 11 in the pixel part 12, plural planar transistors 22 are formed. For example, there are a reset transistor 22R, an amplification transistor 22A, a selection transistor (not shown). In the drawing, the reset transistor 22R and the amplification transistor 22A are shown.

In the planar transistor 22, for example, a gate electrode 22G is formed by a polysilicon film having the same layers as those of the first conducting layer 47 and the second conducting layer 48 via the gate insulator film 32 in the pixel part 12 of the semiconductor substrate 11.

Furthermore, on the semiconductor substrate 11 of the peripheral circuit part 13, planar transistors NFET 23 and PFET 24 are formed.

In the NFET 23, for example, a gate electrode 23G is formed by a film having the same layers as those of the first conducting layer 47 and the second conducting layer 48 via the gate insulator film 32 in the peripheral circuit part 13 of the semiconductor substrate 11.

Further, in the PFET 24, for example, a gate electrode 24G is formed by a film having the same layers as the second conducting layer 48 via the gate insulator film 32 in the peripheral circuit part 13 of the semiconductor substrate 11. Therefore, the second conducting layer 48 forms the gate electrode of the NFET and it is preferable to use the work-function control film suitable for the NFET.

As an example of a material used for the second conducting layer 48, there are metals such as titanium (Ti), molybdenum (Mo), and ruthenium (Ru), alloys containing these metals, and compounds of these metals. Specifically, titanium nitride (TiN) or ruthenium (Ru) is more preferable. The titanium nitride for PFET has a work function of about 4.5 eV to 5.0 eV.

On the semiconductor substrate 11 on both sides of the gate electrode 22G of the planar transistor 22, source and drain regions 25, 26 are formed.

Here, for example, the source and drain region 26 of the reset transistor 22R and the source and drain region 25 of the amplification transistor 22A are formed by a common diffusion layer. Further, the source and drain region 26 of the amplification transistor 22A and the source and drain region (not shown) of the selection transistor (not shown) are formed by a common diffusion layer.

Furthermore, the source and drain region 25 of the reset transistor 22R at the vertical transistor side and the source and drain region of the vertical transistor 21 are common. The common diffusion layer is a floating diffusion FD.

In addition, these diffusion layers may be common or connected using metal wiring.

Therefore, the vertical transistor 21 is a transfer transistor that reads out the signal charge photoelectrically converted by the photoelectric conversion part 51.

On the other hand, on the semiconductor substrate 11 on both sides of the gate electrode 23G of the planar transistor NFET 23 in the peripheral circuit part 13, source and drain regions 27, 28 are formed.

Further, on the semiconductor substrate 11 on both sides of the gate electrode 24G of the planar transistor PFET 24, source and drain regions 29, 30 are formed.

Note that, in the source and drain regions 25 to 30 of the planar transistors 22, NFET 23, PFET 24, extension regions (not shown) may be formed according to need.

Further, on the semiconductor substrate 11, a wiring layer 81 is formed. For example, the wiring layer 81 includes plural layers of wires 82, plugs 83 connecting between the wires, and an insulator film 84 covering the wires 82. The insulator film 84 is formed in plural layers, and the lowermost insulator film 85 covers the respective gate electrodes 21G to 24G. Furthermore, the plural layers of wires 82 are formed in two layers in the drawing, however, the number of layers may be three, four, or more according to need.

In addition, a support substrate (not shown) is formed at the wiring layer 81 side. The side of the semiconductor substrate 11 at which the photoelectric conversion part 51 is formed is formed to have a desired thickness, and a color filter layer, a collector lens (microlens), etc. are formed thereon.

As described above, a solid-state imaging device 4 is configured.

In the solid-state imaging device 4 according to the embodiment of the invention, inside the groove part 31, the conducting layer 35 formed via the gate insulator film 32 on the inner surface thereof, the filling layer 36 filing the interior of the groove part 31, and the gate electrode 21G formed by the electrode layer 37 connected to the conducting layer 35 are formed. Effectively, the conducting layer 35 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode unlike the technology in the past. Further, it is not necessary to perform ion implantation with high energy to allow the implanted ions to reach the bottom of the groove part 31 in the polysilicon filling the groove part 31.

Therefore, the vertical transistor 21 can be configured and the vertical transistor and the planar transistors 22, NFET 23, PFET 24 having minute gate lengths are mounted on the same semiconductor substrate. Accordingly, there are advantages that the higher definition and higher density packaging of the transistors can be achieved and the higher definition and higher image processing speed can be realized.

Further, in the solid-state imaging devices 1 to 4, the main pn-junction of the photoelectric conversion part 51 is formed by the high-density P-type regions 55 and the high-density P-type regions 52. Therefore, the pn-junction is formed within the semiconductor substrate 11 with a part of the pn-junction extending under the planar transistor 22 of the pixel part 12. For example, seen from the side of the semiconductor substrate 11 surface (opposite to the light entrance side), the photodiode 3 is formed over the region adjacent unit pixels sectioned by the second device isolation region 15 for pixel isolation. Seen from the rear side of the semiconductor substrate 11 (the light entrance side), the region of the photoelectric conversion part 51 corresponds to the region of unit pixels.

In the solid-state imaging devices 1 to 4, the photoelectric conversion part 51 is provided under the transfer transistor of the vertical transistor 21, the reset transistor 22R, the amplification transistor 22A, the selection transistor (not shown) of the planar transistors 22, etc. formed on the pixel part 12. In this manner, the photoelectric conversion part 51 is sterically arranged with respect to the respective transistors of the pixel part 12, and thus, as its area is increased, the pixel area can be reduced. Therefore, the larger area of the photoelectric conversion part 51 can be secured and the incident light can be taken from the rear surface of the semiconductor substrate 11, and thereby, miniaturization of the pixel size can be realized without reduction in saturated charge quantity (Qs) and sensitivity.

The channel part of the vertical transistor 21 reads out the photoelectrically converted signal charge from the photoelectric conversion part 51. For the purpose, the gate electrode 21G of the vertical transistor 21 is located at the center of the photoelectric conversion part 51, and the signal charge generated in the entire photoelectric conversion part 51 is efficiently read out through the channel part to the vertical transistor 21. Therefore, the signal charge can be easily read out from the photoelectric conversion part 51.

Further, the high-density N-type region 52 of the photoelectric conversion part 51 also serves as the source and drain region of the vertical transistor 21, and the effective channel length is determined depending on the depth of the vertical transistor 21.

Furthermore, in the vertical transistor 21, its gate electrode and the bottom part of the gate insulator film 32 are formed in the position at the depth equal or more than the depth of the pn-junction part (the interface between the high-density N-type region 52 and the high-density P-type region 55) of the photoelectric conversion part 51. Thereby, the channel of the vertical transistor 21 is reliably formed between the photoelectric conversion part 51 and the source and drain region 25, and the operation of the vertical transistor 21 can be reliably performed.

Moreover, the low-density P-type region 56 is formed between the gate insulator film 32 of the vertical transistor 21 and the high-density N-type region 52 of the photoelectric conversion part 51, and thereby, generation of leak current due to defects of the photoelectric conversion part 51 is suppressed. In addition, the low-density P-type region 54 is formed between the gate insulator film 32 of the vertical transistor 21 and the high-density P-type region 55 of the photoelectric conversion part 51, and thereby, charge transfer by the vertical transistor 21 becomes easier while the charge accumulation capacity of the photoelectric conversion part 51 is held.

Note that, in the solid-state imaging devices 1 to 4, the configuration in which the vertical transistor 21 as the transfer transistor, the reset transistor 22R, the amplification transistor 22A, the selection transistor, etc. are connected by the diffusion layer has been illustrated, however, the respective transistors may be isolated by device isolation regions and connected by wiring.

[One Example of CMOS Solid-State Imaging Device to which Respective Solid-State Imaging Devices can be Applied]

Here, one example of CMOS solid-state imaging device to which the respective solid-state imaging devices 1 to 4 described in FIGS. 1 to 4 can be applied will be explained according to a circuit configuration diagram of FIG. 5.

Figure 5:
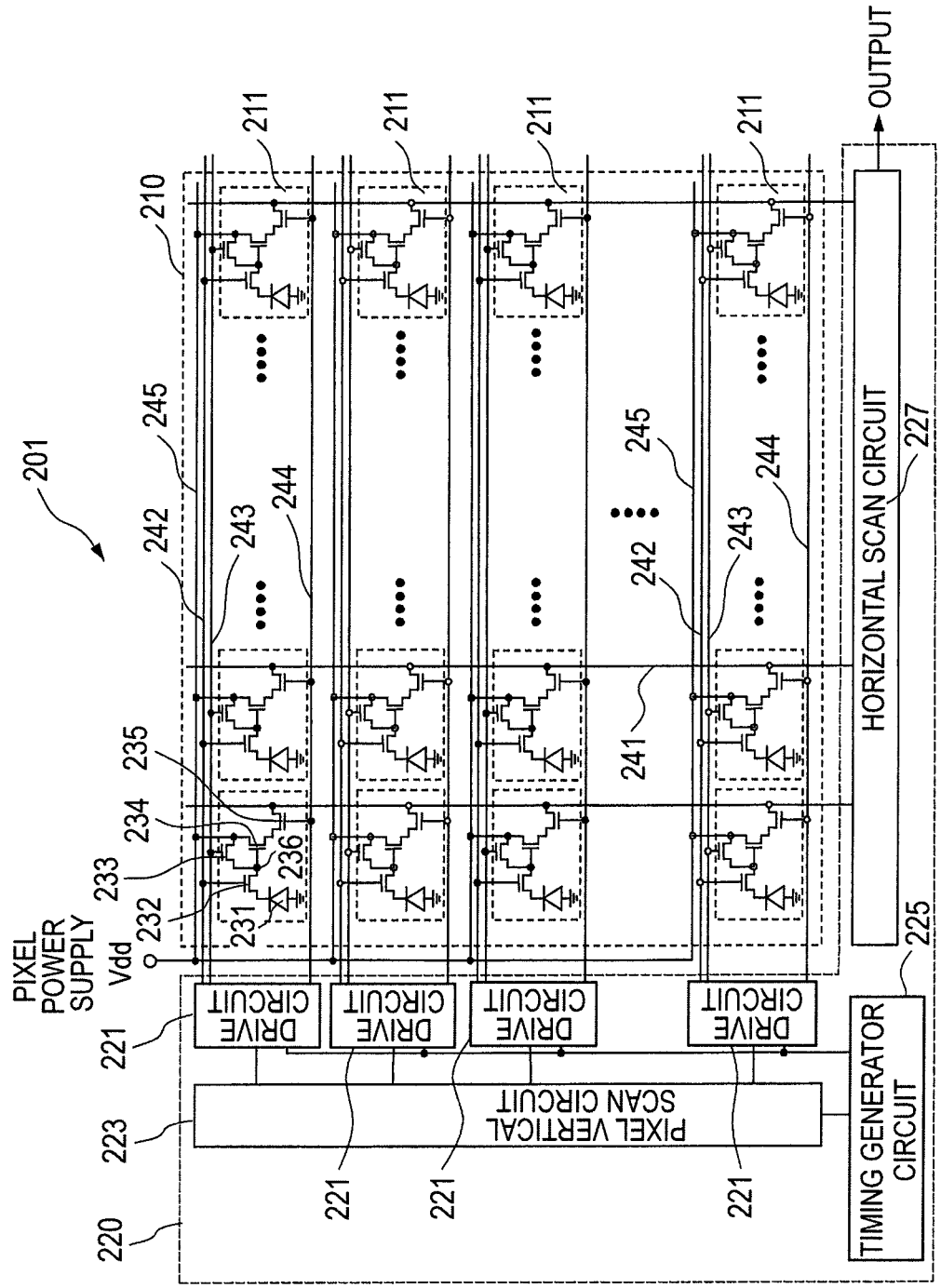
FIG. 5 is a circuit configuration diagram showing an example of a CMOS solid-state imaging device to which the configurations of solid-state imaging device 1 to 4 can be applied.

As shown in FIG. 5, a solid-state imaging device (CMOS image sensor) 201 has a pixel part 210 in which pixels 211 containing photoelectric conversion parts are two-dimensionally arranged in a matrix (corresponding to the pixel part 12 in FIGS. 1 to 4), and a peripheral circuit part 220 (corresponding to the peripheral circuit part 13 in FIGS. 1 to 4) including drive circuits 221 that independently control control signal lines, a pixel vertical scan circuit 223, a timing generator circuit 225, a horizontal scan circuit 227, etc. as a peripheral circuit thereof. The pixel part 210 corresponds to the pixel part 12 described using FIGS. 1 to 4. The peripheral circuit part 220 corresponds to the peripheral circuit part 13 described using FIGS. 1 to 4.

For the matrix arrangement of pixels 211, an output signal line 241 is provided with respect to each column and a control signal line is provided with respect to each row. As these control signal lines, for example, transfer control lines 242, reset control lines 243 and selection control lines 244 are provided. Furthermore, a reset line 245 that supplies a reset voltage is provided for each pixel 211.

An example of the circuit configuration of the pixel 221 is shown. The unit pixel according to the circuit example includes a photodiode as a photoelectric conversion element in a light receiving part 231 and is a pixel circuit having four transistors of a transfer transistor 232, a reset transistor 233, an amplification transistor 234, and a selection transistor 235, for example. The photodiode corresponds to the photoelectric conversion part 51 described using FIGS. 1 to 4. Further, the transfer transistor 232 corresponds to the vertical transistor 21 described using FIGS. 1 to 4. Furthermore, the reset transistor 233 corresponds to the reset transistor 22R described using FIGS. 1 to 4 and the amplification transistor 234 corresponds to the amplification transistor 22A described using FIGS. 1 to 4. Moreover, the selection transistor 235 corresponds to the selection transistor described using FIGS. 1 to 4. Here, as the transfer transistor 232, the reset transistor 233, the amplification transistor 234, and the selection transistor 235, for example N-channel MOS transistors are used.

The transfer transistor 232 is connected between the cathode electrode of the photodiode in the light receiving part 231 and a floating diffusion part 236 as a charge-voltage conversion part. The floating diffusion part 236 corresponds to the floating diffusion part FD described using FIGS. 1 to 4. The signal charge (here, electrons) photoelectrically converted and accumulated in the light receiving part 231 are transferred to the floating diffusion part 236 when a transfer pulse is provided to the gate electrode (control electrode) of the transfer transistor 232.

In the reset transistor 233, the drain electrode is connected to the reset line 245 and the source electrode is connected to the floating diffusion part 236. When a reset pulse is provided to the gate electrode prior to the transfer of signal charge from the light receiving part 231 to the floating diffusion part 236, the potential of the floating diffusion part 236 is reset to a reset voltage.

In the amplification transistor 234, the gate electrode is connected to the floating diffusion part 236 and the drain electrode is connected to a pixel power supply Vdd. The transistor outputs the potential of the floating diffusion part 236 after reset by the reset transistor 233 as a reset level. Further, the transistor outputs the potential of the floating diffusion part 236 after the signal charge is transferred by the transfer transistor 232 as a signal level.

In the selection transistor 235, for example, the drain electrode is connected to the source electrode of the amplification transistor 234 and the source electrode is connected to the output signal line 241. The transistor is turned on when a selection pulse is provided to the gate electrode, and outputs the signal output from the amplification transistor 234 with the pixel 211 in the selected state to the output signal line 241. Note that a configuration in which the selection transistor 235 is connected between the pixel power supply Vdd and the drain electrode of the amplification transistor 234 may be adopted.

The drive circuit 221 is adapted to perform readout operation of reading out the signal of each pixel 211 in the readout row of the pixel part 210.

The pixel vertical scan circuit 223 includes a shift register, an address decoder, or the like. The circuit appropriately generates the reset pulse, the transfer pulse, the selection pulse, and the like, and thereby, vertically scans the respective pixels 211 of the pixel part 210 with respect to each electron shutter row and readout row in units of rows. Concurrently, the circuit performs electron shutter operation on the electron shutter rows for signal sweeping of the pixels 211 in the rows. The circuit performs electron shutter operation on the same row (electron shutter row) for the time corresponding to the shutter speed before the readout scan by the drive circuit 221.

The horizontal scan circuit 227 includes a shift register, an address decoder, or the like, and performs horizontal scan with respect to each pixel column of the pixel part 210.

The timing generator circuits 225 generates timing signals and control signals as reference for the operations of the drive circuits 221, the pixel vertical scan circuit 223, etc.

The configuration of the solid-state imaging device (CMOS image sensor) 201 is only an example, and not limited to the configuration.

5. Fifth Embodiment

One Example of First Manufacturing Method of Solid-State Imaging Device

Next, one example of the first manufacturing method of a solid-state imaging device according to the fifth embodiment of the invention will be explained using manufacturing process sectional views of FIGS. 6 to 14.

The first manufacturing method of a solid-state imaging device according to the embodiment of the invention forms a photoelectric conversion part for photoelectrically converting incident light to obtain an electric signal, and a pixel part including a vertical transistor that reads out the signal charge from the photoelectric conversion part and planar transistors that process the read out signal charge. Concurrently, a peripheral circuit part is formed on the periphery of the pixel part. The peripheral circuit part is formed to have a first conductivity-type (hereinafter, N-type, for example) channel transistor (hereinafter, referred to as NFET), and a second conductivity-type (hereinafter, P-type, for example) channel transistor (hereinafter, referred to as PFET).

The process of forming the gate electrodes of the respective transistors in the pixel part and the peripheral circuit part are as below.

[Manufacturing Process of Gates of Respective Transistors]

Figure 6:
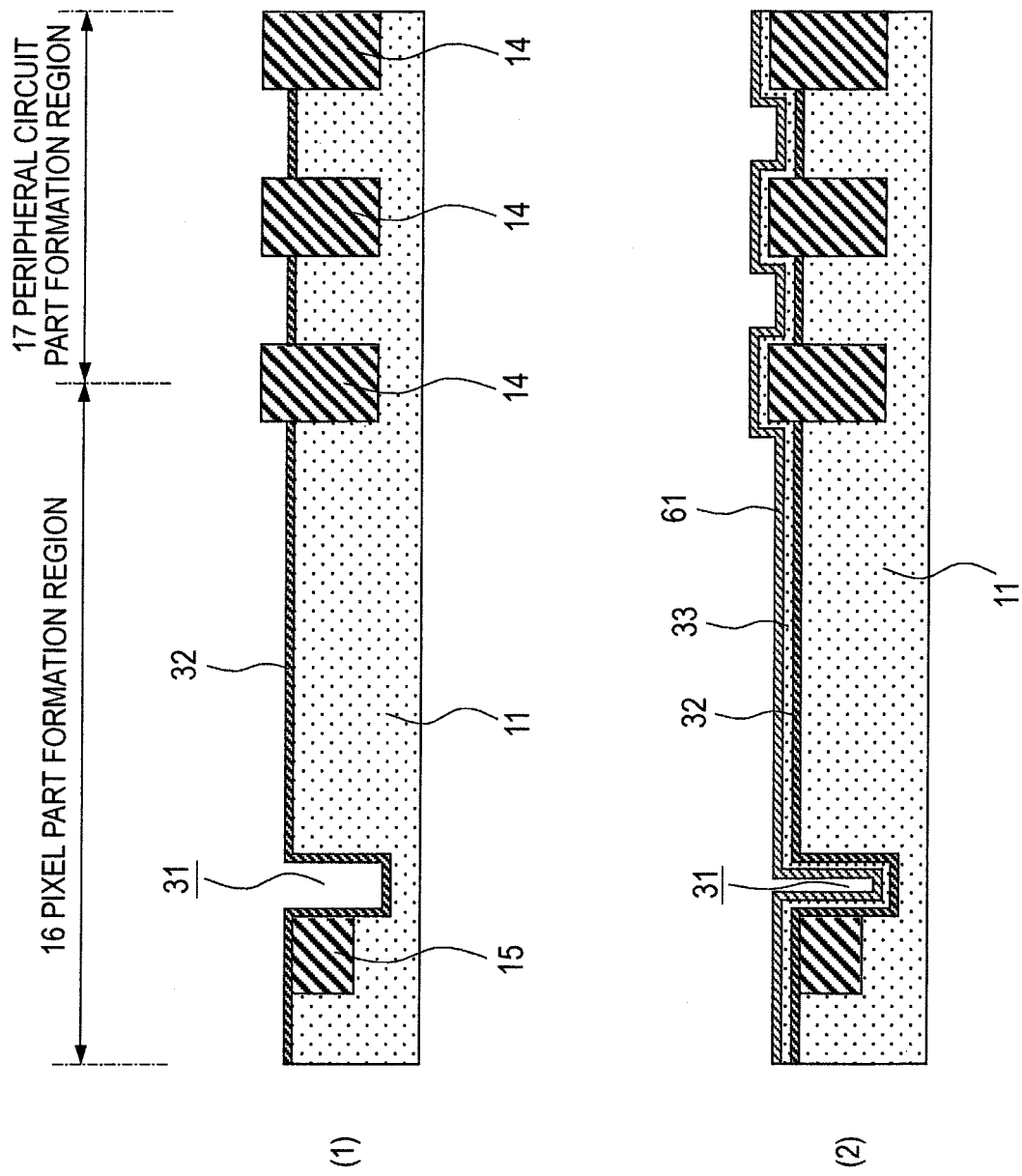
FIG. 6 is a manufacturing process sectional view showing an example of a first manufacturing method of a solid-state imaging device according to a fifth embodiment of the invention.

As shown in (1) in FIG. 6, in the semiconductor substrate 11, first device isolation regions 14 that isolate a pixel part formation region 16 where the pixel part is formed and a peripheral circuit part formation region 17 where the peripheral circuit part are formed. Concurrently, a second device isolation region 15 that isolates the pixels is formed within the pixel part formation region 16 is formed.

Further, though not shown, well regions are formed in the region where the photoelectric conversion part is formed, the region where the transistors of the pixel part are formed, the region where NFET, OPFET of the peripheral circuit part are formed, and so on.

The first device isolation regions 14 are formed by typical STI (Shallow Trench Isolation), for example. Further, the second device isolation region 15 is formed by a P-type diffusion layer, for example.

Furthermore, though not shown in the drawing, the photoelectric conversion part, details of which will be described later, is formed in the semiconductor substrate 11 of the pixel part formation region 16.

Then, a groove part 31 is formed in the region where the gate electrode of the vertical transistor of the semiconductor substrate 11. The groove part 31 is formed by dry etching using a resist mask, for example, to have a width of 0.1 µm to 0.4 µm, for example. The resist mask used as the etching mask is removed after the groove part 31 is formed.

Then, a gate insulator film 32 is formed on the surface of the semiconductor substrate 11 including the inner surface of the groove part 31. For example, the gate insulator film is formed by surface-oxidizing the surface of the semiconductor substrate 11, for example.

Then, as shown in (2) in FIG. 6, on the semiconductor substrate 11 including the inner surface of the groove part 31, a first polysilicon film 33 is formed under the non-doped condition via the gate insulator film 32. For example, by chemical vapor deposition, the first polysilicon film 33 is formed to have a half thickness of the width of the groove part 31 so as not to fill the groove part 31 in a thickness of 30 nm or more, for example.

Furthermore, a protector film 61 is formed on the first polysilicon film 33. The protector film 61 is a silicon oxide film, for example, and formed to have a thickness equal to or more than 10 nm, for example. The silicon oxide film is formed by a film formation technology such as thermal oxidation, chemical vapor deposition, or the like.

Figure 7:
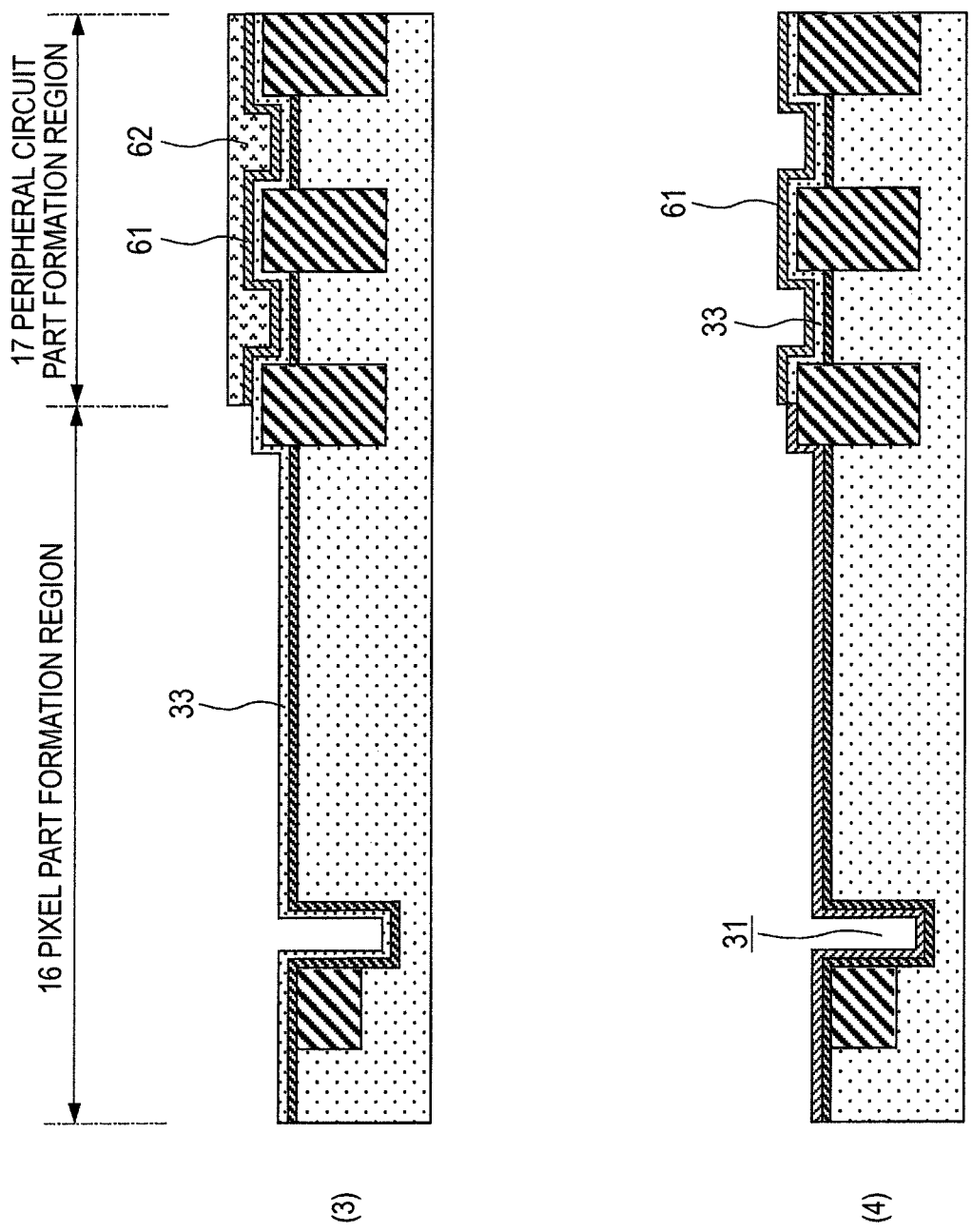
FIG. 7 is a manufacturing process sectional view showing an example of the first manufacturing method of a solid-state imaging device according to the fifth embodiment of the invention.

Then, as shown in (3) in FIG. 7, a resist mask 62 is formed on the protector film 61 of the peripheral circuit part formation region 17. Then, using the resist mask 62 as an etching mask, the protector film 61 is removed and the first polysilicon film 33 is exposed on the pixel part formation region 16.

Then, the resist mask 62 is removed. In the drawing, the state immediately before the removal of the resist mask 62 is shown.

Then, as shown in (4) in FIG. 7, a first conductivity-type impurity (e.g., an N-type impurity) is doped in the first polysilicon film 33 of the pixel part formation region 16. For example, isotropic doping such as vapor-phase doping is used. When the N-type impurity is doped, for example, phosphorus (P) or arsenic (As) is used, and, when a P-type impurity is doped, for example, boron (B) is used. The doping density is set to density at which the impurity density of $1 \times 10^{19}$ cm$^{-3}$ can be secured or higher even when the dopant diffuses in the entire polysilicon including a second polysilicon film, which will be formed later.

Then, the protector film 61 is removed. In the drawing, the state immediately before the removal of the protector film 61 is shown.

Figure 8:
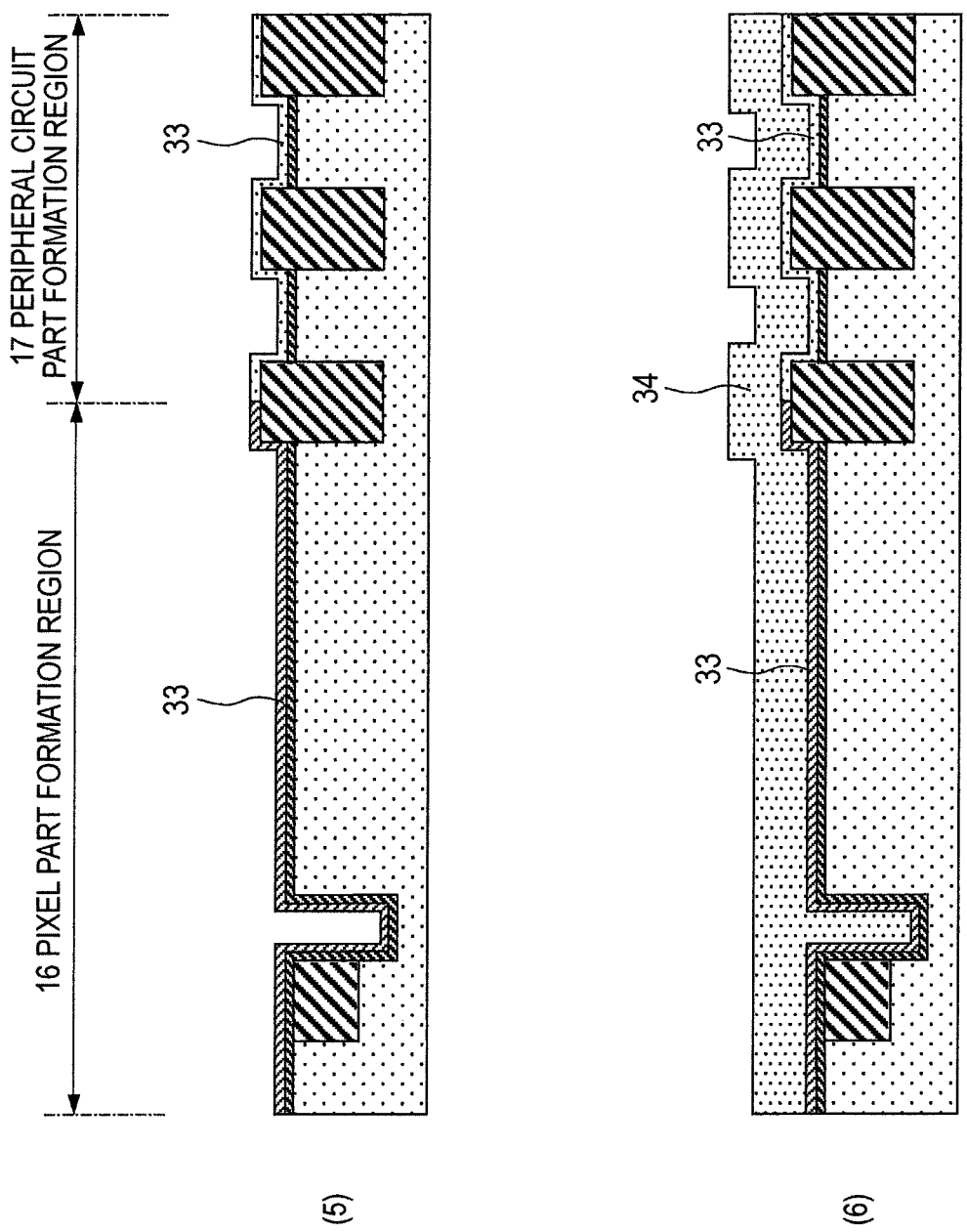
FIG. 8 is a manufacturing process sectional view showing an example of the first manufacturing method of a solid-state imaging device according to the fifth embodiment of the invention.

As a result, as shown in (5) in FIG. 8, the first polysilicon film 33 is doped with the impurity in the pixel part formation region 16 but non-doped in the peripheral circuit part formation region 17.

Then, as shown in (6) in FIG. 8, the second polysilicon film 34 is formed on the first polysilicon film 33 under the non-doped condition.

Figure 9:
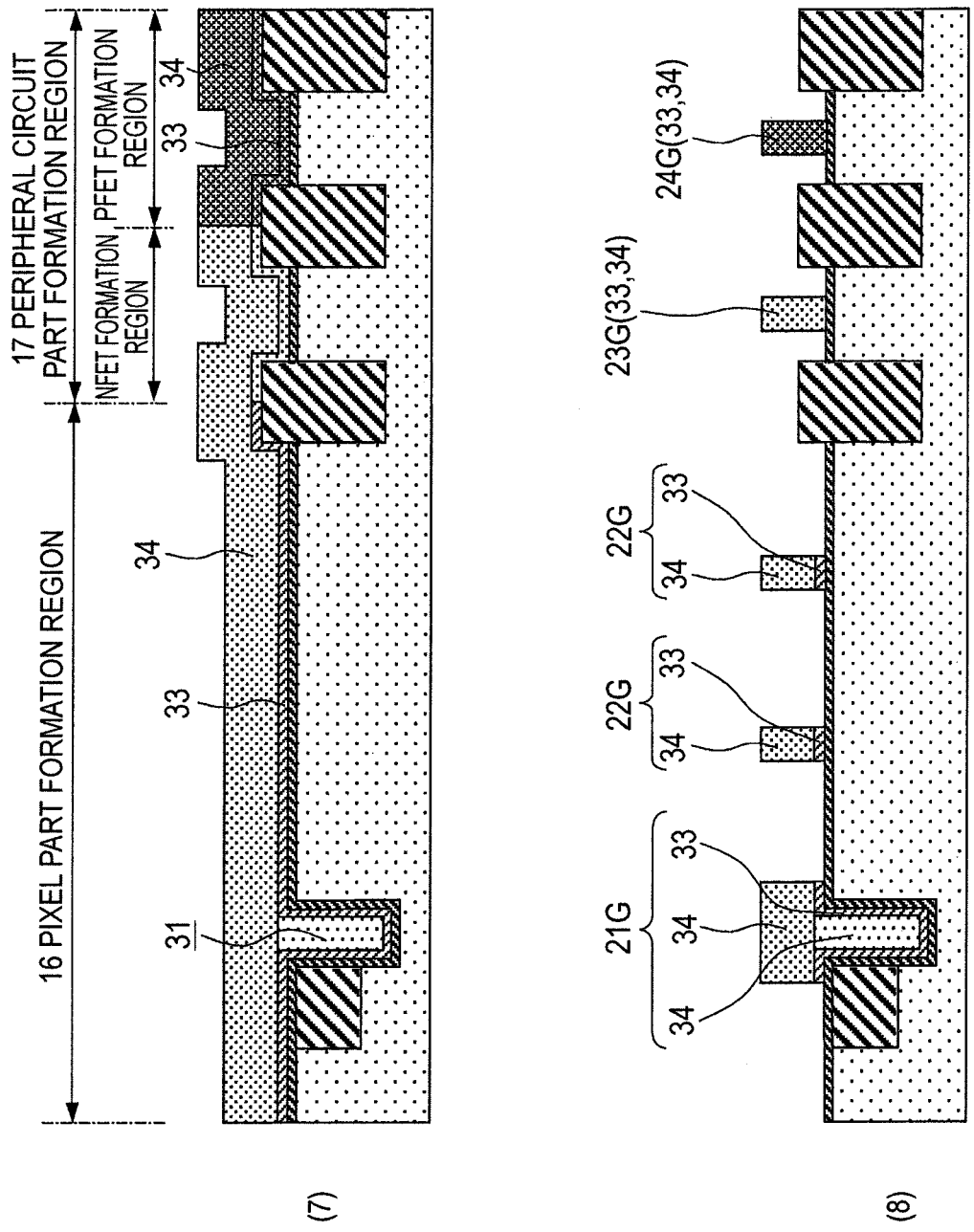
FIG. 9 is a manufacturing process sectional view showing an example of the first manufacturing method of a solid-state imaging device according to the fifth embodiment of the invention.

Then, as shown in FIG. 9(7), the N-type impurity is doped in the second polysilicon film 34 and the first polysilicon film 33 in the pixel part formation region 16 and the region where the NFET is formed on the peripheral circuit part formation region 17. Here, the N-type impurity is not ion-implanted in the second polysilicon film 34 within the groove part 31, the non-doped second polysilicon film 34 is left, and a filling layer 36 is formed. Note that, through the thermal process, the N-type impurity may be diffused.

Further, the second polysilicon film 34 and the first polysilicon film 33 on the region where the PFET is formed are doped with the P-type impurity.

For example, in the case of N-type, phosphorus (P) or arsenic (As) is used as the dopant, and the energy is set to 5 keV to 10 keV, the dose amount is set to $1 \times 10^{15}$ ions/cm$^2$ to $1 \times 10^{16}$ ions/cm$^2$.

For example, in the case of P-type, boron (B) or BF$_2$, indium (In) is used as the dopant, and the energy is set to 5 keV to 10 keV, the dose amount is set to $1 \times 10^{15}$ ions/cm$^2$ to $1 \times 10^{16}$ ions/cm$^2$.

Then, as shown in FIG. 9(8), with the first polysilicon film 33 and the second polysilicon film 34, the gate electrode 21G of the vertical transistor 21, gate electrodes 22G of the planar transistors of the pixel part, gate electrodes 23G, 24G of the respective transistors of the peripheral circuit part are formed.

Accordingly, the gate electrode 21G includes a conducting layer 35 of the first polysilicon film 33 doped with the N-type impurity, the filling layer 36, and a part of the second polysilicon film 34 doped with the N-type impurity. Further, the gate electrodes 22G and the gate electrode 23G include the first polysilicon film 33 doped with the first conductivity-type impurity and the second polysilicon film 34 doped with the first conductivity-type impurity. Furthermore, the gate electrode 24G includes the first polysilicon film 33 and the second polysilicon film 34 doped with the second conductivity-type impurity.

In place of the first polysilicon film 33, an amorphous silicon film may be used.

[Manufacturing Process of Photoelectric Conversion Part]

Here, an example of a method of forming the photoelectric conversion part will be described as below.

Figure 10:
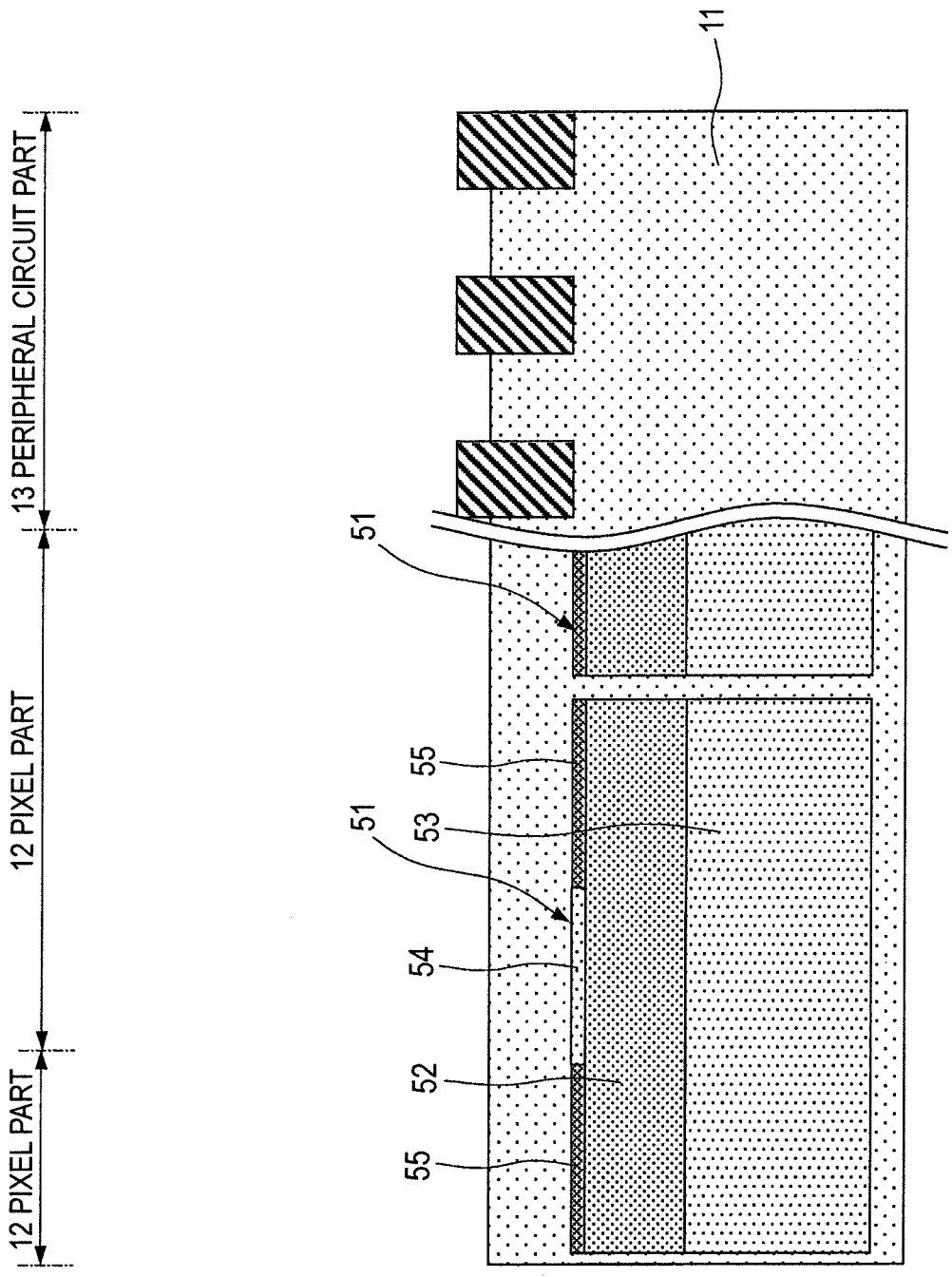
FIG. 10 is a manufacturing process sectional view showing an example of the first manufacturing method of a solid-state imaging device according to the fifth embodiment of the invention.

As shown in FIG. 10(1), as the semiconductor substrate 11, for example, a p-type semiconductor substrate is prepared.

A photoelectric conversion part 51 is formed on the semiconductor substrate 11. The photoelectric conversion part 51 includes a photodiode.

For example, by ion implantation using a resist mask (not shown), an N-type semiconductor region (hereinafter, referred to as "high-density N-type region") 52 is formed at the surface side of the semiconductor substrate 11. Then, under the region, an N-type semiconductor region (hereinafter, referred to as "low-density N-type region") 53 at the lower density than that of the high-density N-type region 52 is formed in junction with the region. Furthermore, by ion implantation of the p-type impurity, a P-type semiconductor region (hereinafter, referred to as "low-density P-type regions") 54 is formed on the high-density N-type region 52.

Then, the resist mask is removed.

Next, by ion implantation using a new resist mask (not shown), with the low-density P-type region 54 left in a part on the high-density N-type region 52, around the region 54, P-type semiconductor regions (hereinafter, referred to as "high-density P-type regions") 55 at the higher density than that of the low-density P-type region 54 are formed. It is preferable that the low-density P-type region 54 is left at the center on the high-density N-type region 52 for easy readout of charge.

Figure 11:
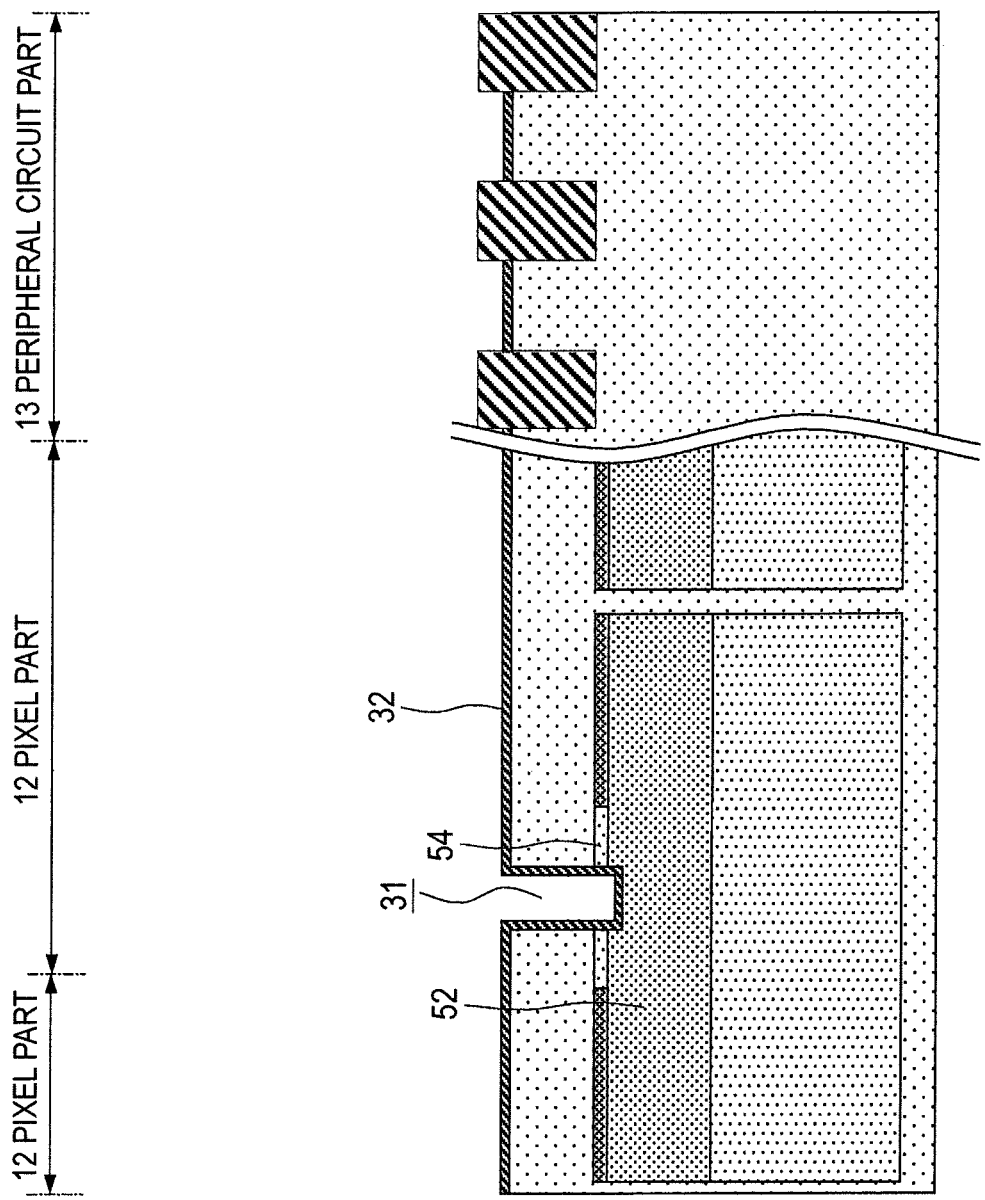
FIG. 11 is a manufacturing process sectional view showing an example of the first manufacturing method of a solid-state imaging device according to the fifth embodiment of the invention.

Then, as shown in FIG. 11(2), a groove part 31 that has been explained using (1) in FIG. 6 is formed, and a gate insulator film 32 is formed. The groove part 31 is formed to penetrate the low-density P-type region 54 and reach the upper part of the high-density N-type region 52.

Figure 12:
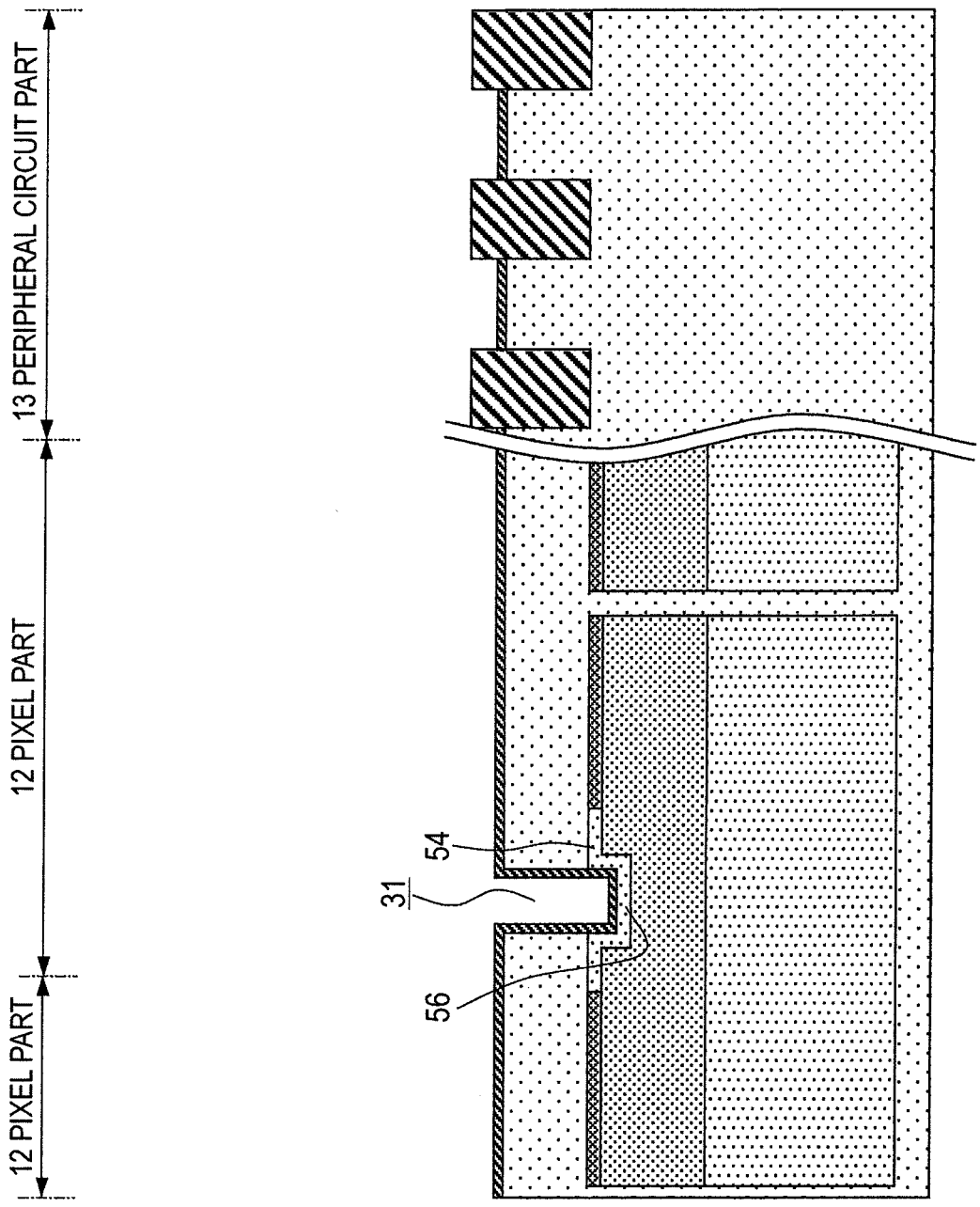
FIG. 12 is a manufacturing process sectional view showing an example of the first manufacturing method of a solid-state imaging device according to the fifth embodiment of the invention.

Then, as shown in FIG. 12(3), by oblique ion implantation, in the semiconductor substrate 11 at the bottom side of the groove part 31 and at the lower side thereof, a low-density P-type region 56 having nearly equal density to that of the low-density P-type region 54 is formed.

Figure 13:
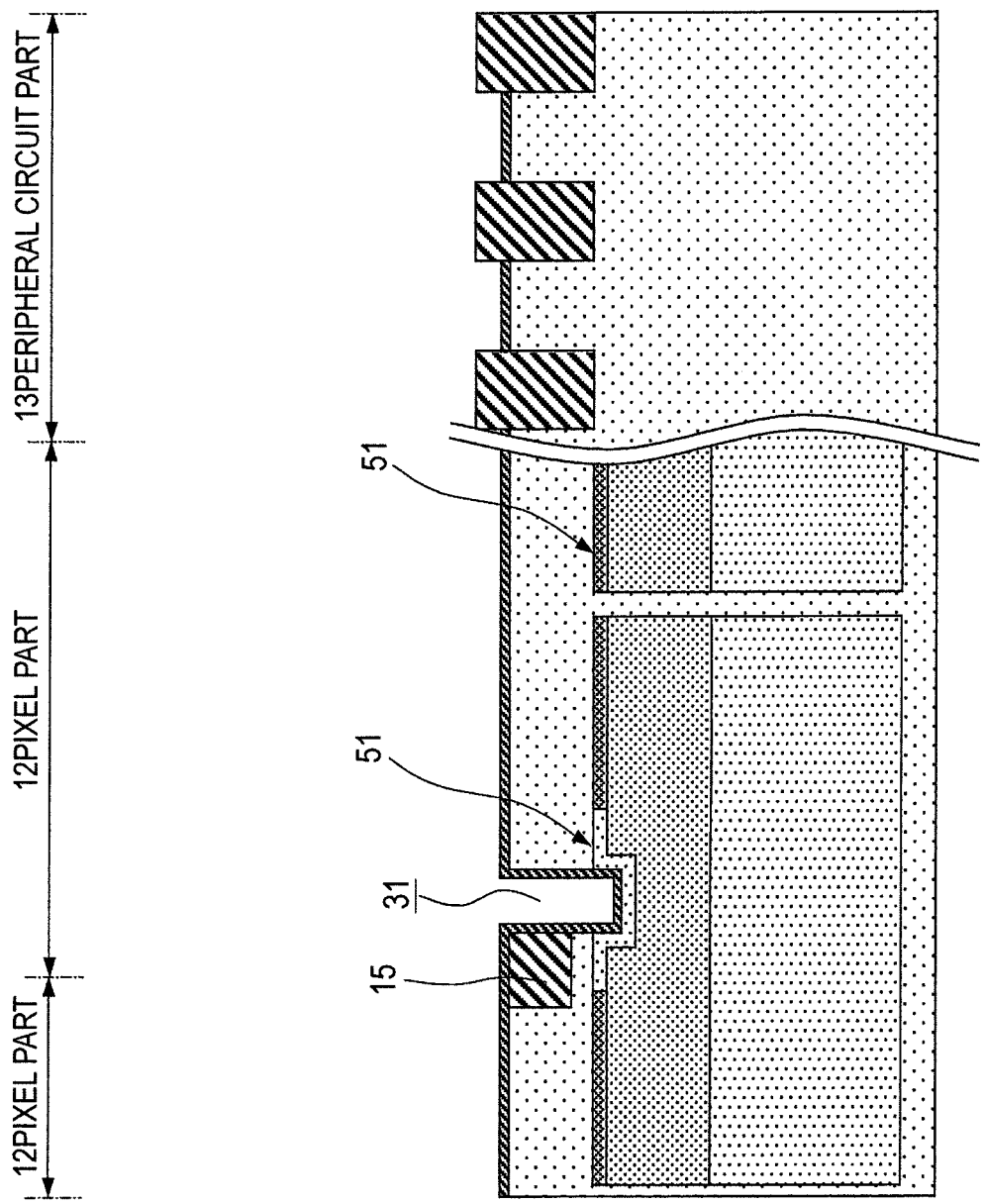
FIG. 13 is a manufacturing process sectional view showing an example of the first manufacturing method of a solid-state imaging device according to the fifth embodiment of the invention.

Then, as shown in FIG. 13(4), a second device isolation region 15 that isolates the pixels formed within the pixel part formation region 16 is formed. Note that the second device isolation region 15 may be formed after formation of the photoelectric conversion part 51 and before formation of the groove part 31.

In this manner, the photoelectric conversion part 51 is formed.

[Manufacturing Process after Formation of Gate Electrodes of Transistors]

Figure 14:
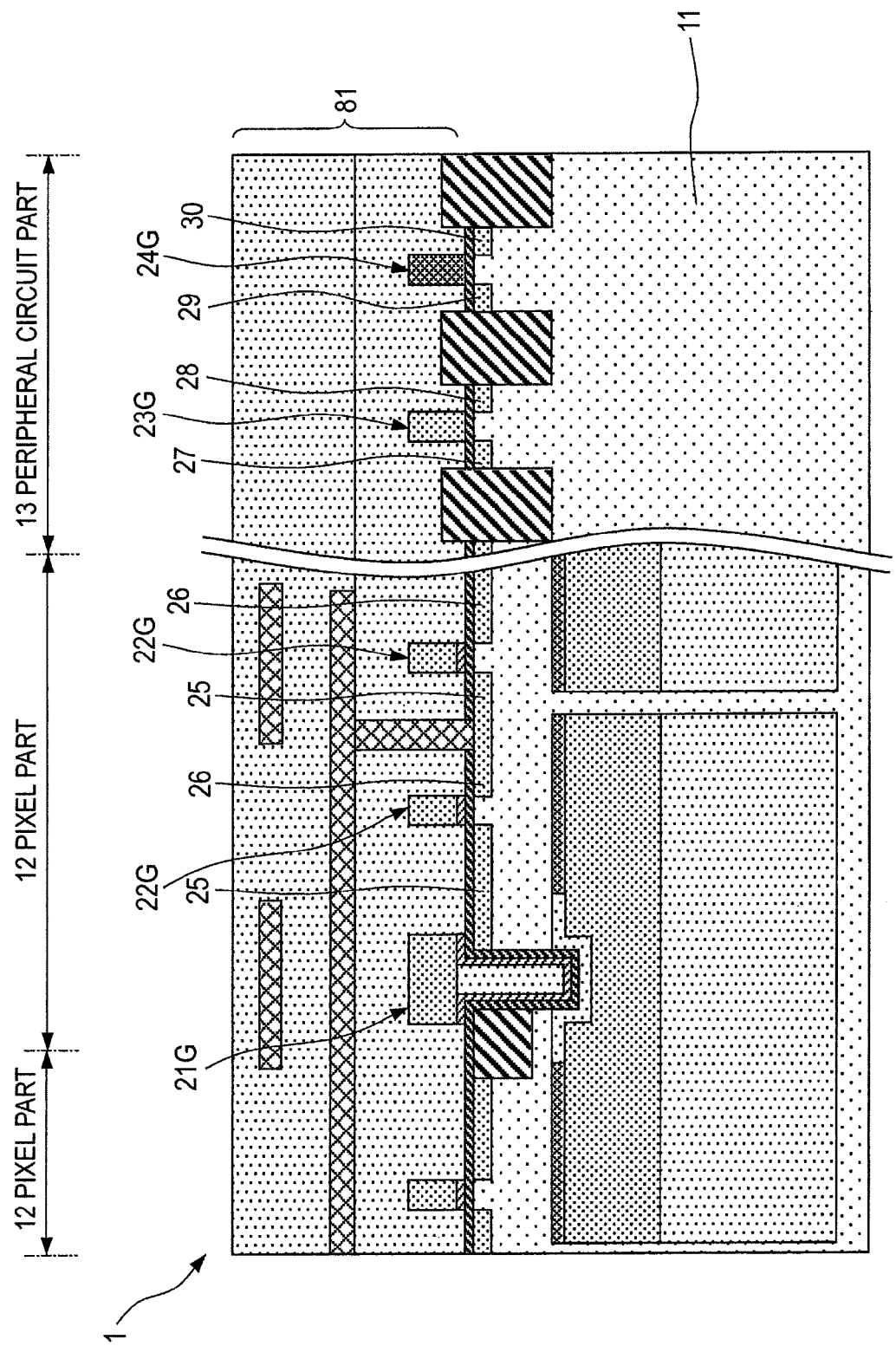
FIG. 14 is a manufacturing process sectional view showing an example of the first manufacturing method of a solid-state imaging device according to the fifth embodiment of the invention.

Furthermore, as shown in FIG. 14, after the gate electrodes 21G to 24G of the respective transistors are formed, in the same manner as described in the first manufacturing method, in the semiconductor substrate 11 on both sides of the respective gate electrodes 21G to 24G, extension regions (not shown) and source and drain regions 25 to 30, and so on are formed. Moreover, on the semiconductor substrate 11, a wiring layer 81 is formed.

Then, though not shown, after a support substrate is formed at the wiring layer 81 side, the side of the semiconductor substrate 11 at which the photoelectric conversion part 51 is formed is ground or polished so that the semiconductor substrate 11 may have a desired thickness.

Then, a color filter layer, a collector lens (microlens), etc. are formed at the semiconductor substrate 11 side.

In this manner, a solid-state imaging device 1 is completed.

In the first manufacturing method of a solid-state imaging device according to the embodiment of the invention, the conducting layer 35 that effectively functions as a gate electrode is formed by doping a conducting impurity in the first polysilicon film 33 formed on the inner surface of the groove part 31 via the gate insulating film 32. Further, the gate electrode 21G is formed by the filing layer 36 of the non-doped second polysilicon film 34 filling the interior of the groove part 36 and the electrode layer 37 of the second polysilicon film 34 doped with the first conductivity-type impurity connected to the first polysilicon film 33. Effectively, the conducting layer 35 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode of the vertical transistor unlike the technology in the past. Further, it is not necessary to perform ion implantation with high energy to allow the implanted ions to reach the bottom of the groove part 31 in the polysilicon filling the groove part 31.

For example, Y. Nishida et al., IEDM Tech. Dig., pp. 869-872, December 2001 discloses that, typically, in a surface channel CMOSFET as a planar transistor, it is necessary to form the gate electrode of NFET in N-type and the gate electrode of PFET in P-type.

Further, a technology using in-situ doped polysilicon for the respective gate electrodes of the vertical transistor and the planar transistor has been known. In the technology, there is a method of filling the vertical hole in which the vertical transistor is formed and forming the gate electrode of CMOSFET of the planar transistor. However, according to the method, it is difficult to make the CMOSFET because the conductivity of the gate electrode of the NFET or PFET of the CMOSFET is inverted to the original conductivity.

In order to avoid this, it is conceivable that the gate electrodes of the vertical transistor and the planar transistor are separately made, however, in this case, the number of steps is increased and the cost is increased. Further, when the gate of the planar transistor is worked, there is a level difference of the vertical transistor that has been formed before, and residues are left in the gate etching of the planar transistor. Thereby, reduction in yield is caused.

On the other hand, in the first manufacturing method of a solid-state imaging device according to the embodiment of the invention, the gate electrodes 23G, 24G of the planar transistors (NFET 23, PFET 24) of the pixel part 12 and the peripheral circuit part 13 are formed by doping predetermined conductivity-type impurities in the non-doped first polysilicon film 33 and the non-doped second polysilicon film 34. Accordingly, the gate electrode 23G of the NFET 23 and the gate electrode 24G of the PFET 24 are separately formed in N-type and P-type, respectively. In addition, the gate electrodes 23G, 24G having minute gate lengths can be formed.

Therefore, the vertical transistor 21 and the planar transistors 22 to 24 having minute gate lengths are mounted on the same semiconductor substrate. Accordingly, there are advantages that the higher definition and higher density packaging of the transistors can be achieved and the higher definition and higher image processing speed can be realized. Further, reduction in yield is not caused unlike the technology in the past.

6. Sixth Embodiment

Second Example of Manufacturing Method of Solid-State Imaging Device

Next, the second example of the manufacturing method of a solid-state imaging device according to the sixth embodiment of the invention will be explained using manufacturing process sectional views of FIGS. 15 to 17.

The second manufacturing method of a solid-state imaging device according to the embodiment of the invention forms a photoelectric conversion part for photoelectrically converting incident light to obtain an electric signal, and a pixel part including a vertical transistor that reads out signal charge from the photoelectric conversion part and planar transistors that process the read out signal charge. Concurrently, a peripheral circuit part is formed on the periphery of the pixel part. The peripheral circuit part is formed to have a first conductivity-type (hereinafter, N-type, for example) channel transistor (hereinafter, referred to as NFET), and a second conductivity-type (hereinafter, P-type, for example) channel transistor (hereinafter, referred to as PFET).

The process of forming the gate electrodes of the respective transistors in the pixel part and the peripheral circuit part are as below.

[Manufacturing Process of Gates of Respective Transistors]

Figure 15:
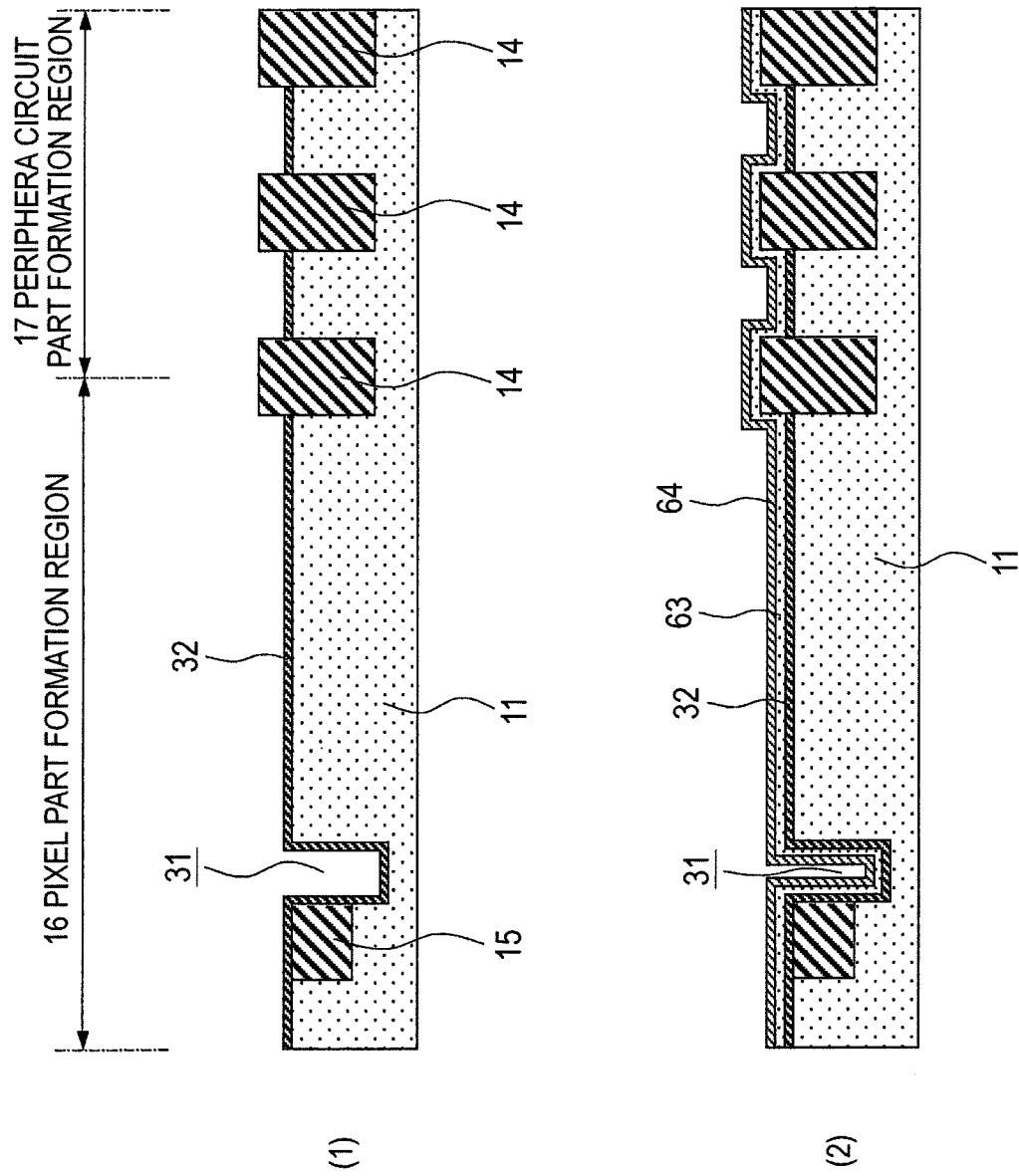
FIG. 15 is a manufacturing process sectional view showing an example of a second manufacturing method of a solid-state imaging device according to a sixth embodiment of the invention.

As shown in (1) in FIG. 15, in the semiconductor substrate 11, first device isolation regions 14 that isolate a pixel part formation region 16 where the pixel part is formed and a peripheral circuit part formation region 17 where the peripheral circuit part is formed. Concurrently, a second device isolation region 15 that isolates the pixels is formed within the pixel part formation region 16.

Further, though not shown, well regions are formed in the region where the photoelectric conversion part is formed, the region where the transistors of the pixel part are formed, the region where NFET, OPFET of the peripheral circuit part are formed, and so on.

The first device isolation regions 14 are formed by typical STI (Shallow Trench Isolation), for example. Further, the second device isolation region 15 is formed by a P-type diffusion layer, for example.

Furthermore, though not shown in the drawing, the photoelectric conversion part, details of which have been described according to FIG. 14, is formed in the semiconductor substrate 11 of the pixel part formation region 16.

Then, a groove part 31 is formed in the region where the gate electrode of the vertical transistor of the semiconductor substrate 11 is formed. The groove part 31 is formed by dry etching using a resist mask, for example, to have a width of 0.1 μm to 0.4 μm, for example. The resist mask used as the etching mask is removed after the groove part 31 is formed.

Then, a gate insulator film 32 is formed on the surface of the semiconductor substrate 11 including the inner surface of the groove part 31. For example, the gate insulator film is formed by surface-oxidizing the surface of the semiconductor substrate 11, for example.

Then, as shown in (2) in FIG. 15, on the semiconductor substrate 11 including the inner surface of the groove part 31, a polysilicon film 63 is formed under the non-doped condition via the gate insulator film 32. For example, by chemical vapor deposition, the polysilicon film 63 is formed to have a half thickness of the width of the groove part 31 so as not to fill the groove part 31 in a thickness of 30 nm or more, for example.

Furthermore, a protector film 64 is formed on the polysilicon film 63. The protector film 64 is a silicon oxide film, for example, and formed to have a thickness equal to or more than 10 nm, for example. The silicon oxide film is formed by a film formation technology such as thermal oxidation, chemical vapor deposition, or the like.

Figure 16:
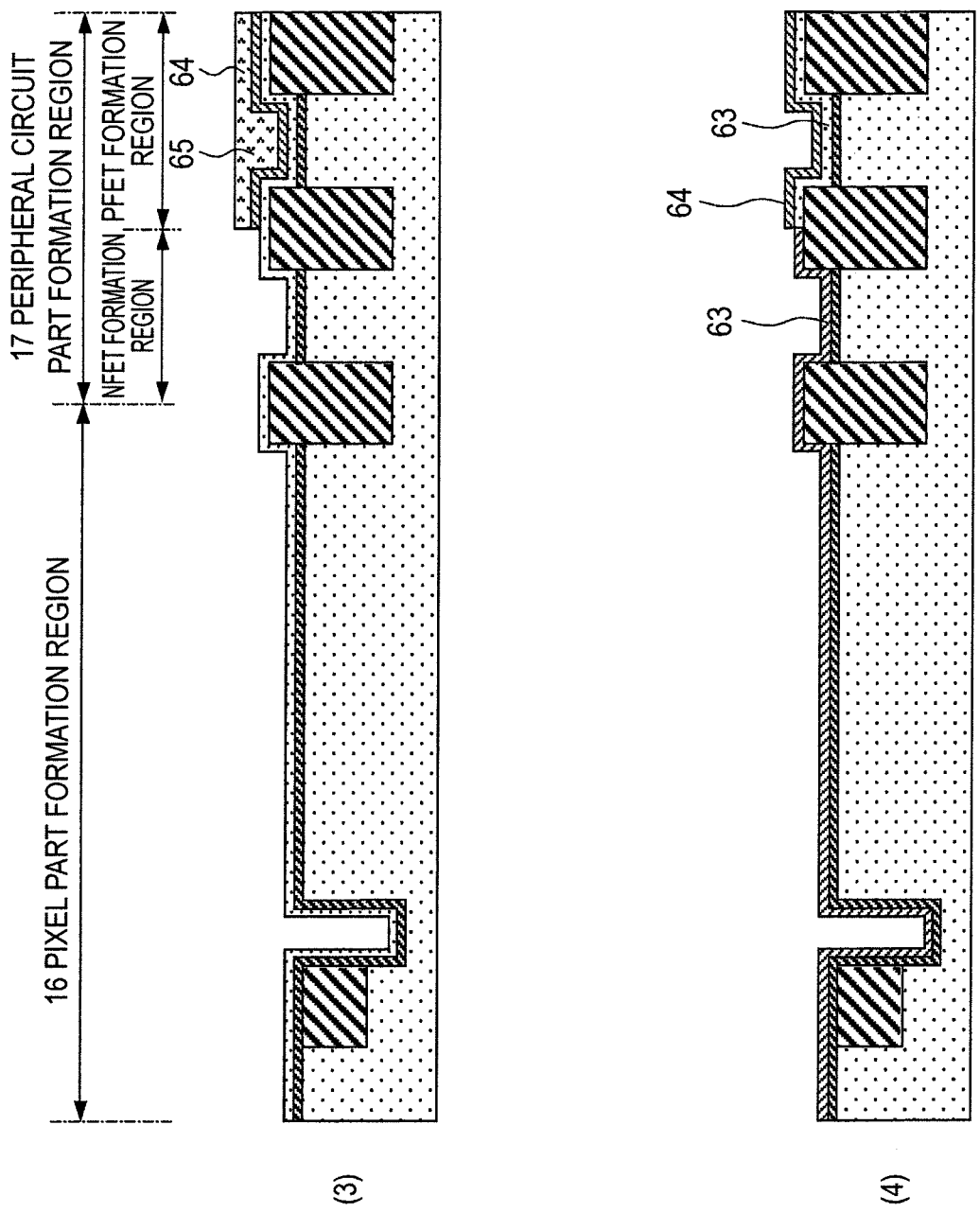
FIG. 16 is a manufacturing process sectional view showing an example of the second manufacturing method of a solid-state imaging device according to the sixth embodiment of the invention.

Then, as shown in (3) in FIG. 16, a resist mask 65 is formed on the protector film 64 of the formation region of the PFET of the peripheral circuit part formation region 17. Then, using the resist mask 65 as an etching mask, the protector film 64 is removed and the polysilicon film 63 is exposed on the pixel part formation region 16 and the formation region of the NFET of the peripheral circuit part formation region 17.

Then, the resist mask 65 is removed. In the drawing, the state immediately before the removal of the resist mask 65 is shown.

Then, as shown in (4) in FIG. 16, a polysilicon film 38 doped with the first conductivity-type impurity is formed by doping the first conductivity-type impurity (e.g., the N-type impurity) in the polysilicon film 63 in the pixel part formation region 16 and the formation region of the NFET of the peripheral circuit part formation region 17. For example, isotropic doping such as vapor-phase doping is used. When the N-type impurity is doped as the first conductivity-type impurity, for example, phosphorus (P) or arsenic (As) is used. When a P-type impurity is doped, for example, boron (B) is used. The doping density is set to density at which the impurity density of $1 \times 10^{19}$ cm$^{-3}$ can be secured or higher for suppressing gate depletion even when the dopant diffuses in the entire polysilicon including a second polysilicon film, which will be formed later.

Then, the protector film 64 is removed. In the drawing, the state immediately before the removal of the protector film 64 is shown.

Figure 17:
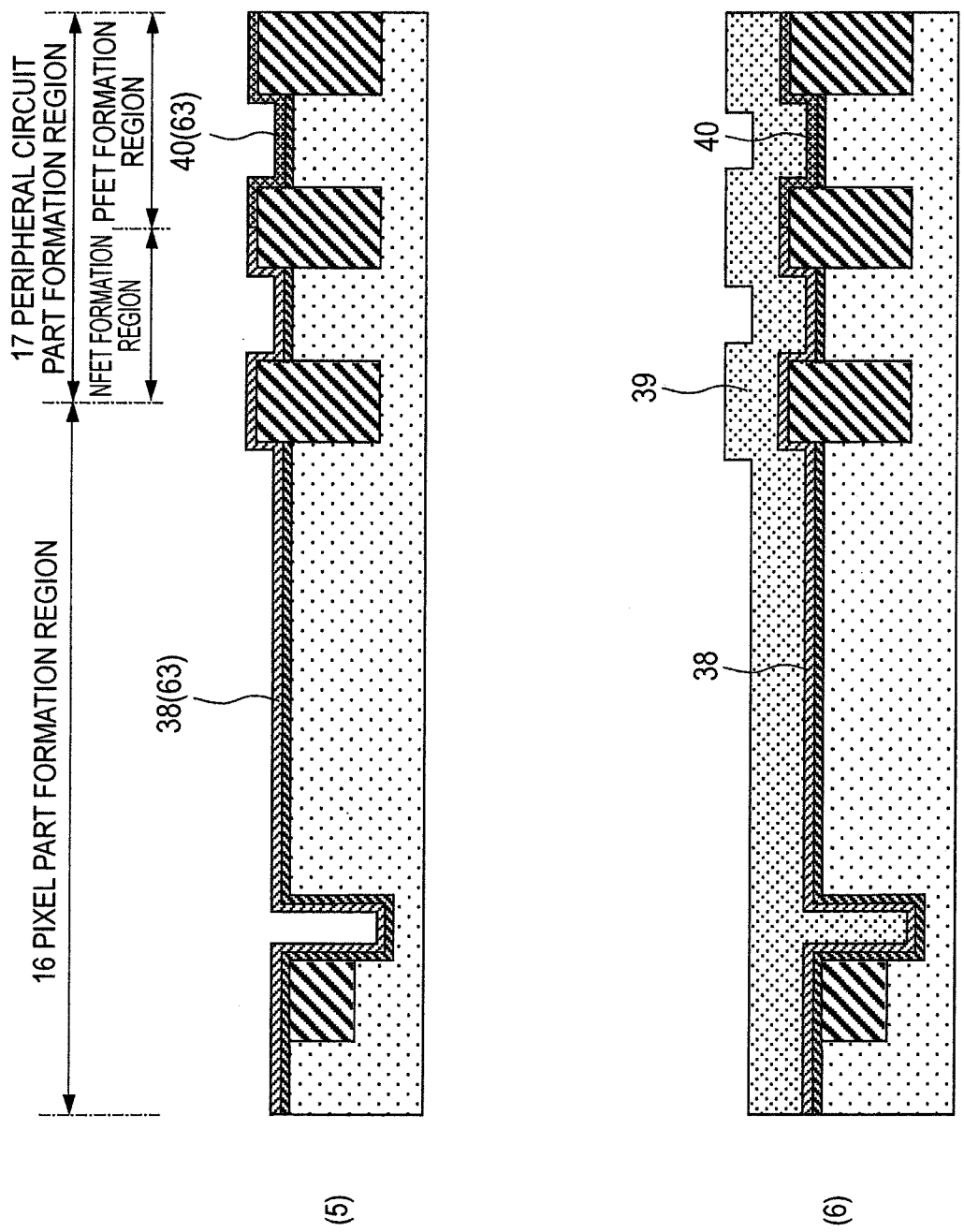
FIG. 17 is a manufacturing process sectional view showing an example of the second manufacturing method of a solid-state imaging device according to the sixth embodiment of the invention.

As a result, as shown in (5) in FIG. 17, when the N-type impurity is used as the first conductivity-type impurity, the polysilicon film 63 is doped with the N-type impurity in the pixel part formation region 16 and the formation region of the NFET of the peripheral circuit part formation region 17 and non-doped in the formation region of the PFET of the peripheral circuit part formation region 17.

Then, a resist mask (not shown) is formed on the polysilicon film 63, and an opening part (not shown) is formed on the region where the PFET is formed in the peripheral circuit part formation region of the resist mask. The resist mask is used as an ion implantation mask, the second conductivity-type impurity (e.g., the P-type impurity) is doped in the polysilicon film 63, and thereby, a polysilicon film 40 doped with the second conductivity-type impurity is formed. Then, the resist mask is removed.

Then, as shown in (6) in FIG. 17, a metal film (or a metal compound film) 39 is formed on the polysilicon films 38, 40. For the metal film, for example, a metal such as tungsten or nickel may be used. For the metal compound film, for example, a metal nitride such as tungsten nitride or titanium nitride, or a metal silicide such as nickel silicide or cobalt silicide may be used.

Figure 18:
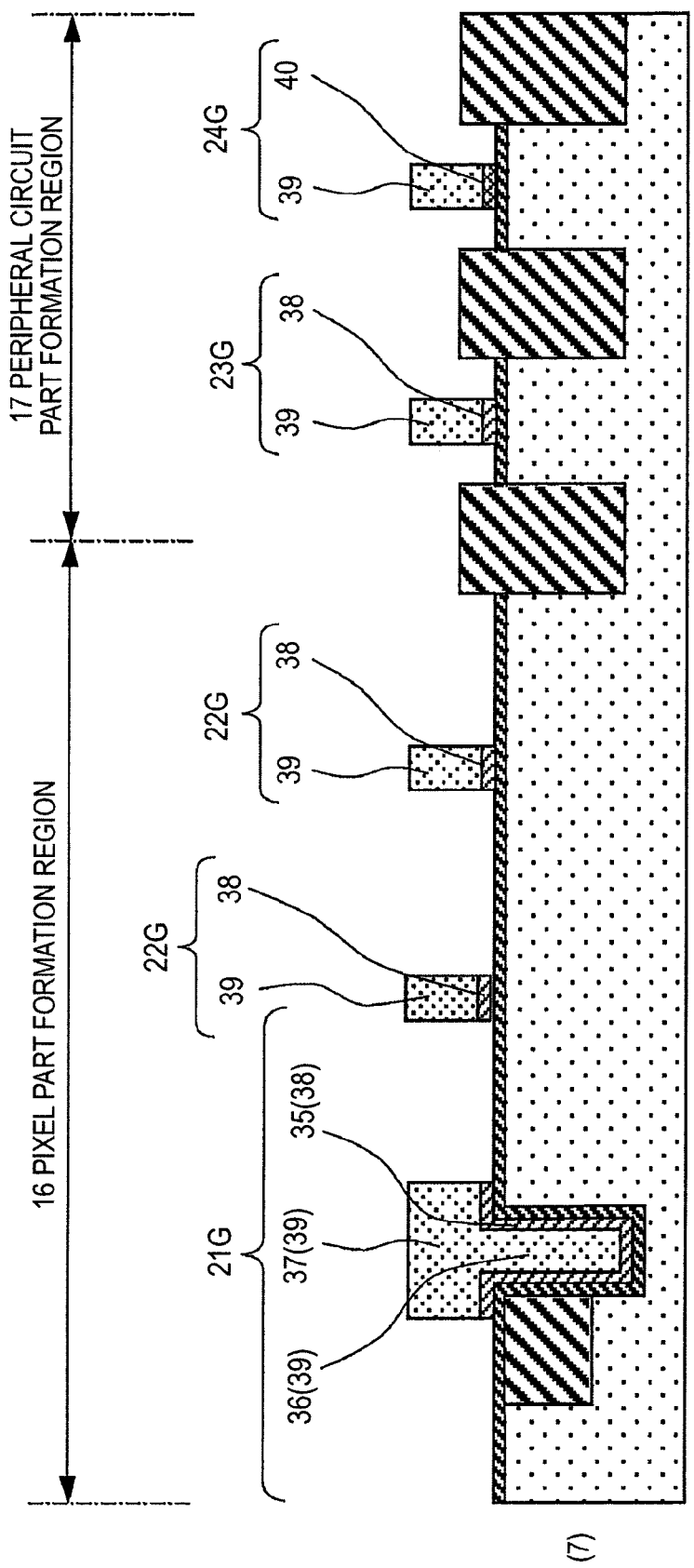
FIG. 18 is a manufacturing process sectional view showing an example of the second manufacturing method of a solid-state imaging device according to a seventh embodiment of the invention.

Then, as shown in FIG. 18(7), with the polysilicon films 38, 40 and the metal film (or the metal compound film) 39, a gate electrode 21G of the vertical transistor, a gate electrode 22G of the planar transistor 22 of the pixel part 12, and gate electrodes 23G, 24G of the respective transistors of the peripheral circuit part 13 are formed.

Accordingly, the gate electrode 21G includes the conducting layer 35 of the polysilicon film 38 doped with the N-type impurity, a filling layer 36 of the metal layer (or the metal compound layer) 39, and an electrode layer 37. Further, the gate electrode 22G and the gate electrode 23G include the polysilicon film 38 doped with the first conductivity-type impurity and the metal layer (or the metal compound layer) 39. Furthermore, the gate electrode 24G includes the polysilicon film 40 doped with the second conductivity-type impurity and the metal layer (or the metal compound layer) 39.

In place of the polysilicon film 63, an amorphous silicon film may be used.

[Manufacturing Process of Photoelectric Conversion Part]

Further, a manufacturing process of the photoelectric conversion part is performed in the same manner as that explained in the first manufacturing method. Here, the formation location of the groove 31 relative to the photoelectric conversion part 51 is the same as that explained in the first manufacturing method.

[Manufacturing Process after Formation of Gate Electrodes of Transistors]

Furthermore, after the gate electrodes 21G to 24G of the respective transistors are formed, in the same manner as described according to FIG. 14 in the first manufacturing method, in the semiconductor substrate 11 on both sides of the respective gate electrodes 21G to 24G, extension regions (not shown) and source and drain regions 25 to 30, and so on are formed. Moreover, on the semiconductor substrate 11, a wiring layer 81 is formed.

Then, though not shown, after a support substrate is formed at the wiring layer 81 side, the side of the semiconductor substrate 11 at which the photoelectric conversion part 51 is formed is ground or polished so that the semiconductor substrate 11 may have a desired thickness.

Then, a color filter layer, a collector lens (microlens), etc. are formed at the semiconductor substrate 11 side.

In the second manufacturing method of a solid-state imaging device according to the embodiment of the invention, the conducting layer 35 that effectively functions as the gate electrode 21G is formed by doping a conducting impurity in the polysilicon film 63 formed on the inner surface of the groove part 31 via the gate insulating film 32. Further, the gate electrode 21G is formed by the filing layer 36 of the metal film (or the metal compound film) filling the interior of the groove part 31 and the electrode layer 37 of the metal film (or the metal compound film) connected to the conducting layer 35. Effectively, the conducting layer 35 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode of the vertical transistor unlike the technology in the past. Further, it is not necessary to perform ion implantation with high energy to allow the implanted ions to reach the bottom of the groove part 31 in the polysilicon filling the groove part 31.

For example, Y. Nishida et al., IEDM Tech. Dig., pp. 869-872, December 2001 discloses that, typically, in a surface channel CMOSFET as a planar transistor, it is necessary to form the gate electrode of NFET in N-type and the gate electrode of PFET in P-type.

Further, a technology using in-situ doped polysilicon for the respective gate electrodes of the vertical transistor and the planar transistor has been known. In the technology, there is a method of filling the vertical hole in which the vertical transistor is formed and forming the gate electrode of CMOSFET of the planar transistor. However, according to the method, it is difficult to make the CMOSFET because the conductivity of the gate electrode of the NFET or PFET of the CMOSFET is inverted to the original conductivity.

In order to avoid this, it is conceivable that the gate electrodes of the vertical transistor and the planar transistor are separately made, however, in this case, the number of steps is increased and the cost is increased. Further, when the gate of the planar transistor is worked, there is a level difference of the vertical transistor that has been formed before, and residues are left in the gate etching of the planar transistor. Thereby, reduction in yield is caused.

On the other hand, in the second manufacturing method of a solid-state imaging device according to the embodiment of the invention, the gate electrodes 23G, 24G of the planar transistors (NFET 23, PFET 24) of the pixel part 12 and the peripheral circuit part 13 are formed by doping predetermined conductivity-type impurities in the non-doped polysilicon film 63 formed immediately on the gate electrode 32. Accordingly, the gate electrode 23G of the NFET 23 and the gate electrode 24G of the PFET 24 are separately formed in N-type and P-type, respectively. In addition, the gate electrodes 23G, 24G having minute gate lengths can be formed.

Therefore, the vertical transistor 21 and the planar transistors 22, NFET 23, PFET 24 having minute gate lengths are mounted on the same semiconductor substrate 11. Accordingly, there are advantages that the higher definition and higher density packaging of the transistors can be achieved and the higher definition and higher image processing speed can be realized. Further, reduction in yield is not caused unlike the technology in the past.

7. Seventh Embodiment

Third Example of Manufacturing Method of Solid-State Imaging Device

Next, the third example of the manufacturing method of a solid-state imaging device according to the seventh embodiment of the invention will be explained using manufacturing process sectional views of FIGS. 19 to 20.

The third manufacturing method of a solid-state imaging device according to the embodiment of the invention forms a photoelectric conversion part for photoelectrically converting incident light to obtain an electric signal, and a pixel part including a vertical transistor that reads out signal charge from the photoelectric conversion part and planar transistors that process the read out signal charge. Concurrently, a peripheral circuit part is formed on the periphery of the pixel part. The peripheral circuit part is formed to have a first conductivity-type (hereinafter, N-type, for example) channel transistor (hereinafter, referred to as NFET), and a second conductivity-type (hereinafter, P-type, for example) channel transistor (hereinafter, referred to as PFET).

The process of forming the gate electrodes of the respective transistors in the pixel part and the peripheral circuit part are as below.

[Manufacturing Process of Gates of Respective Transistors]

Figure 19:
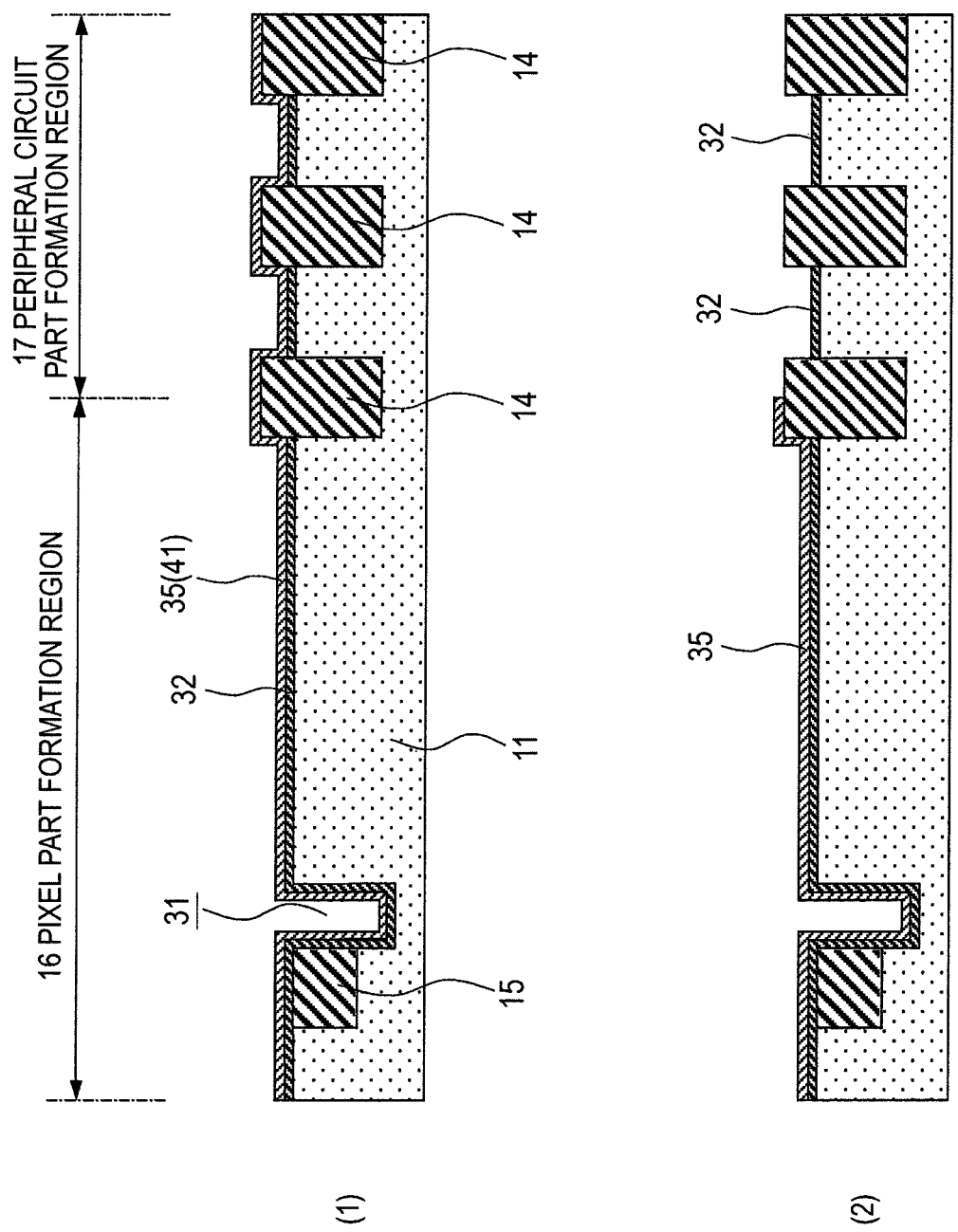
FIG. 19 is a manufacturing process sectional view showing an example of a third manufacturing method of a solid-state imaging device according to the seventh embodiment of the invention.

As shown in (1) in FIG. 19, in the semiconductor substrate 11, first device isolation regions 14 that isolate a pixel part formation region 16 where the pixel part is formed and a peripheral circuit part formation region 17 where the peripheral circuit part is formed. Concurrently, a second device isolation region 15 that isolates the pixels is formed within the pixel part formation region 16.

Further, though not shown, well regions are formed in the region where the photoelectric conversion part is formed, the region where the transistors of the pixel part are formed, the region where NFET, OPFET of the peripheral circuit part are formed, and so on.

The first device isolation regions 14 are formed by typical STI (Shallow Trench Isolation), for example. Further, the second device isolation region 15 is formed by a P-type diffusion layer, for example.

Furthermore, though not shown in the drawing, the photoelectric conversion part, details of which have been described according to FIG. 14, is formed in the semiconductor substrate 11 of the pixel part formation region 16.

Then, a groove part 31 is formed in the region where the gate electrode of the vertical transistor of the semiconductor substrate 11. The groove part 31 is formed by dry etching using a resist mask, for example, to have a width of 0.1 μm to 0.2 μm, for example. The resist mask used as the etching mask is removed after the groove part 31 is formed.

Then, a gate insulator film 32 is formed on the surface of the semiconductor substrate 11 including the inner surface of the groove part 31. For example, the gate insulator film is formed by surface-oxidizing the surface of the semiconductor substrate 11, for example.

Alternatively, as the gate insulator film 32, a film including an oxide, silicate, nitrided oxide, or oxidized nitrided silicate containing at least one kind selected from silicon (Si), aluminum (Al), yttrium (Y), zirconium (Zr), lanthanum (La), hafnium (Hf), and tantalum (Ta) may be used.

Specifically, silicon oxide ($SiO_2$), hafnium oxide ($HfO_2$), zirconium oxide ($ZrO_2$), lanthanum oxide ($La_2O_3$), yttrium oxide ($Y_2O_3$), tantalum oxide ($Ta_2O_5$), aluminum oxide ($Al_2O_3$), hafnium silicate ($HfSiO_x$), zirconium silicate ($ZrSiO_x$), zirconium titanate ($ZrTiO_x$), hafnium aluminum oxide ($HfAlO_x$), zirconium aluminum oxide ($ZrAlO_x$), and further, nitride of them (silicon oxynitride (SiON), hafnium silicide oxynitride (HfSiON), etc.) are cited. The relative permittivity of these materials may slightly vary depending on composition and crystalline property. For example, the relative permittivity of $HfO_2$ is 25 to 30, and the relative permittivity of $ZrO_2$ is 20 to 25.

Then, on the semiconductor substrate 11 including the inner surface of the groove part 31, a conducting layer 35 including a metal film (or a metal compound film) 41 is formed via the gate insulator film 32. For the metal film, for example, hafnium (Hf) or lanthanoid metal is used, and the film is formed to have a thickness from 5 nm to 30 nm so as not to fill the groove part 31. As the metal compound film, for example, hafnium silicide or silicide of lanthanoid metal is used, and the film is formed to have a thickness from 5 nm to 30 nm so as not to fill the groove part 31.

Note that, a film that controls a work function may be used for the conducting layer 35.

For example, in the case of NFET, its gate electrode has a work function less than 4.6 eV, desirably equal to less than 4.3 eV. In the case of PFET, its gate electrode has a work function equal to or more than 4.6 eV, desirably equal to more than 4.9 eV.

For example, as an example of the work-function control film, there are metals of titanium (Ti), vanadium (V), nickel (Ni), zirconium (Zr), niobium (Nb), molybdenum (Mo), ruthenium (Ru), hafnium (Hf), tantalum (Ta), tungsten (W), platinum (Pt), alloys containing these metals, and compounds of these metals. As the metal compounds, there are metal nitrides and compounds of metal and semiconductor. The compounds of metal and semiconductor include a metal silicate as an example.

As an example of the work-function control film suitable for NFET, there are metals such as hafnium (Hf) and tantalum (Ta), and alloys containing these metals, and compounds of these metals, and specifically, hafnium silicate ($HfSi_x$) is more preferable. The hafnium silicate for nMOSFET has a work function of about 4.1 eV to 4.3 eV.

As an example of the work-function control film suitable for PFET, there are metals such as titanium (Ti), molybdenum (Mo), and ruthenium (Ru) and alloys containing these metals, and compounds of these metals. Specifically, titanium nitride (TiN) or ruthenium (Ru) is more preferable. The titanium nitride for pMOSFET has a work function of about 4.5 eV to 5.0 eV.

Then, as shown in (2) in FIG. 19, a resist mask (not shown) is formed on the pixel part formation region 16. Then, the conducting layer 35 of the peripheral circuit part formation region 17 is removed using the resist mask as an etching mask. As a result, the gate insulator film 32 of the peripheral circuit part formation region 17 is exposed.

Then, the resist mask is removed.

Figure 20:
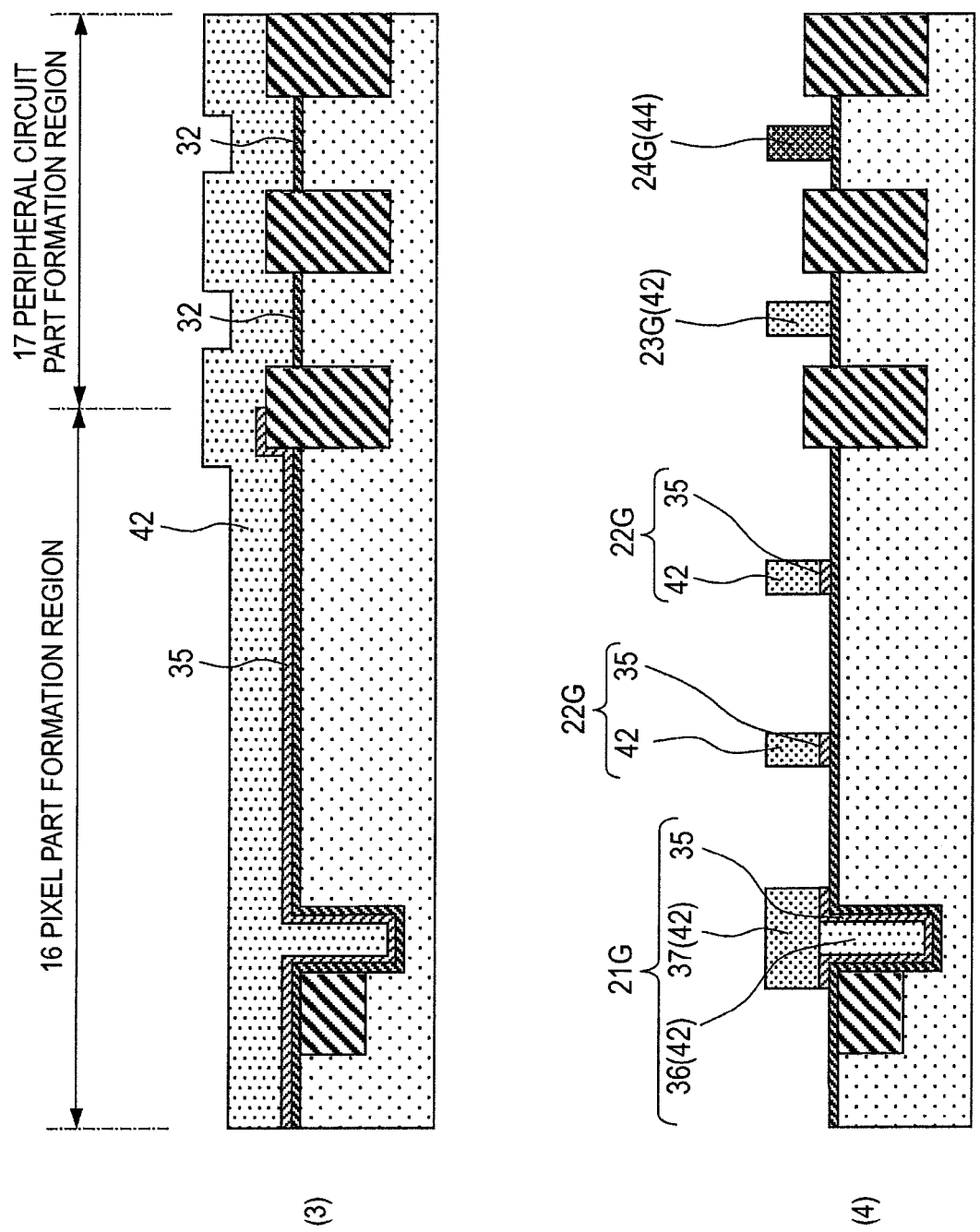
FIG. 20 is a manufacturing process sectional view showing an example of the third manufacturing method of a solid-state imaging device according to the seventh embodiment of the invention.

Then, as shown in (3) in FIG. 20, a polysilicon film 42 is formed under the non-doped condition on the gate insulator film 32 including the conducting layer 35, for example.

Then, as shown in (4) in FIG. 20, the first conductivity-type impurity (e.g., N-type impurity) is doped in the polysilicon film 42 in the region where the pixel part formation region 16 and the region where the NFET of the peripheral circuit part formation region 17 are formed. Here, the N-type impurity is not ion-implanted in the polysilicon film 42 within the groove part 31, and the non-doped polysilicon film 42 is left. Note that, through the thermal process, the N-type impurity may be diffused.

Further, a polysilicon film 44 doped with the second conductivity-type impurity is formed by doping the second conductivity-type impurity (e.g., the P-type impurity) in the polysilicon film 42 on the region where the PFET of the peripheral circuit part formation region 17 is formed.

For example, in the case of N-type, phosphorus (P) or arsenic (As) is used as the dopant, and the energy is set to 5 keV to 10 keV, the dose amount is set to $1\times10^{15}$ ions/cm² to $1\times10^{16}$ ions/cm².

For example, in the case of P-type, boron (B) or $BF_2$, indium (In) is used as the dopant, and the energy is set to 5 keV to 10 keV, the dose amount is set to $1\times10^{15}$ ions/cm² to $1\times10^{16}$ ions/cm².

Then, with the conducting layer 35 and the polysilicon film 42, the gate electrode 21G of the vertical transistor, gate electrodes 22G of the planar transistors of the pixel part, gate electrodes 23G, 24G of the respective transistors of the peripheral circuit part are formed.

Accordingly, the gate electrode 21G includes the conducting layer 35, a filling layer 36 including the non-doped polysilicon film 42, and an electrode layer including the polysilicon film 42 doped with the first conductivity-type impurity. Further, the gate electrodes 22G includes the conducting layer 35 and the polysilicon film 42 doped with the first conductivity-type impurity. Further, the gate electrode 23G includes the polysilicon film 42 doped with the first conductivity-type impurity. Furthermore, the gate electrode 24G includes the polysilicon film 42 doped with the second conductivity-type impurity.

[Manufacturing Process of Photoelectric Conversion Part]

Further, a manufacturing process of the photoelectric conversion part is performed in the same manner as that explained in the first manufacturing method. Here, the formation location of the groove 31 relative to the photoelectric conversion part 51 is the same as that explained in the first manufacturing method.

[Manufacturing Process after Formation of Gate Electrodes of Transistors]

Furthermore, after the gate electrodes 21G to 24G of the respective transistors are formed, in the same manner as described according to FIG. 14 in the first manufacturing method, in the semiconductor substrate 11 on both sides of the respective gate electrodes 21G to 24G, extension regions (not shown) and source and drain regions 25 to 30, and so on are formed. Moreover, on the semiconductor substrate 11, a wiring layer 81 is formed.

Then, though not shown, after a support substrate is formed at the wiring layer 81 side, the side of the semiconductor substrate 11 at which the photoelectric conversion part 51 is formed is ground or polished so that the semiconductor substrate 11 may have a desired thickness.

Then, a color filter layer, a collector lens (microlens), etc. are formed at the semiconductor substrate 11 side.

In the third manufacturing method of a solid-state imaging device according to the embodiment of the invention, the conducting layer 35 of the metal film (or the metal compound film) 41 formed on the inner surface of the groove part 31 via the gate insulating film 32 effectively functions as the gate electrode 21G. Further, the gate electrode 21G is formed by the filing layer 36 of the non-doped polysilicon film 42 filling the interior of the groove part 31 and a polysilicon film 43 doped with the first conductivity-type impurity connected to the metal film (or the metal compound film) 41. Effectively, the conducting layer 35 of the metal film (or the metal compound film) 41 has a function of the gate electrode 21G. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode of the vertical transistor unlike the technology in the past. Further, it is not necessary to perform ion implantation with high energy to allow the implanted ions to reach the bottom of the groove part 31 in the polysilicon filling the groove part 31.

For example, Y. Nishida et al., IEDM Tech. Dig., pp. 869-872, December 2001 discloses that, typically, in a surface channel CMOSFET as a planar transistor, it is necessary to form the gate electrode of NFET in N-type and the gate electrode of PFET in P-type.

Further, a technology using in-situ doped polysilicon for the respective gate electrodes of the vertical transistor and the planar transistor has been known. In the technology, there is a method of filling the vertical hole in which the vertical transistor is formed and forming the gate electrode of CMOSFET of the planar transistor. However, according to the method, it is difficult to make the CMOSFET because the conductivity of the gate of the NFET or PFET of the CMOSFET is inverted to the original conductivity.

In order to avoid this, it is conceivable that the gate electrode of the vertical transistor and the planar transistor are separately made, however, in this case, the number of steps is increased and the cost is increased. Further, when the gate of the planar transistor is worked, there is a level difference of the vertical transistor that has been formed before, and residues are left in the gate etching. Thereby, reduction in yield is caused.

On the other hand, in the third manufacturing method of a solid-state imaging device according to the embodiment of the invention, the gate electrodes 23G, 24G of the planar transistors (NFET 23, PFET 24) of the peripheral circuit part are formed by doping predetermined conductivity-type impurities in the non-doped polysilicon film 42 formed immediately on the gate electrode 32. Accordingly, the gate electrode 23G of the NFET 23 and the gate electrode 24G of the PFET 24 are separately formed in N-type and P-type, respectively. In addition, the gate electrodes 23G, 24G having minute gate lengths can be formed.

Therefore, the vertical transistor 21 and the planar transistors 22, NFET 23, PFET 24 having minute gate lengths are mounted on the same semiconductor substrate 11. Accordingly, there are advantages that the higher definition and higher density packaging of the transistors can be achieved and the higher definition and higher image processing speed can be realized. Further, reduction in yield is not caused unlike the technology in the past.

8. Eighth Embodiment

Fourth Example of Manufacturing Method of Solid-State Imaging Device

Next, the fourth example of the manufacturing method of a solid-state imaging device according to the eighth embodiment of the invention will be explained using manufacturing process sectional views of FIGS. 21 to 22.

The fourth manufacturing method of a solid-state imaging device according to the embodiment of the invention forms a photoelectric conversion part for photoelectrically converting incident light to obtain an electric signal, and a pixel part including a vertical transistor that reads out the signal charge from the photoelectric conversion part and planar transistors that process the read out signal charge. Concurrently, a peripheral circuit part is formed on the periphery of the pixel part. The peripheral circuit part is formed to have a first conductivity-type (hereinafter, N-type, for example) channel transistor (hereinafter, referred to as NFET), and a second conductivity-type (hereinafter, P-type, for example) channel transistor (hereinafter, referred to as PFET).

The process of forming the gate electrodes of the respective transistors in the pixel part and the peripheral circuit part are as below.

[Manufacturing Process of Gates of Respective Transistors]

Figure 21:
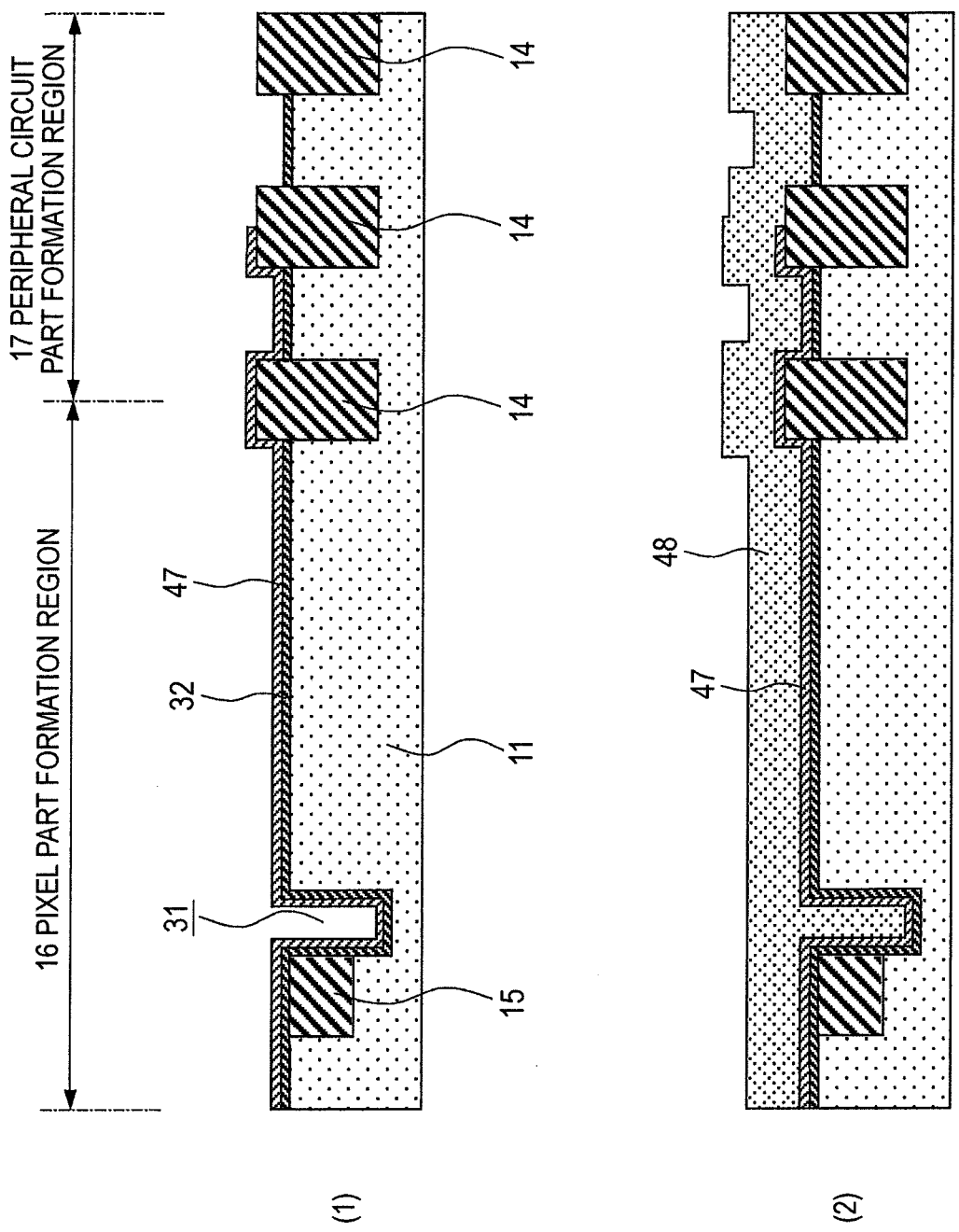
FIG. 21 is a manufacturing process sectional view showing an example of a fourth manufacturing method of a solid-state imaging device according to an eighth embodiment of the invention.

As shown in (1) in FIG. 21, in the semiconductor substrate 11, first device isolation regions 14 that isolate a pixel part formation region 16 where the pixel part is formed and a peripheral circuit part formation region 17 where the peripheral circuit part is formed. Concurrently, a second device isolation region 15 that isolates the pixels is formed within the pixel part formation region 16.

Further, though not shown, well regions are formed in the region where the photoelectric conversion part is formed, the region where the transistors of the pixel part are formed, the region where NFET, OPFET of the peripheral circuit part are formed, and so on.

The first device isolation regions 14 are formed by typical STI (Shallow Trench Isolation), for example. Further, the second device isolation region 15 is formed by a P-type diffusion layer, for example.

Furthermore, though not shown in the drawing, the photoelectric conversion part, details of which have been described according to FIG. 14, is formed in the semiconductor substrate 11 of the pixel part formation region 16.

Then, a groove part 31 is formed in the region where the gate electrode of the vertical transistor of the semiconductor substrate 11. The groove part 31 is formed by dry etching using a resist mask, for example, to have a width of 0.1 μm to 0.2 μm, for example. The resist mask used as the etching mask is removed after the groove part 31 is formed.

Then, a gate insulator film 32 is formed on the surface of the semiconductor substrate 11 including the inner surface of the groove part 31. For example, the gate insulator film is formed by surface-oxidizing the surface of the semiconductor substrate 11, for example.

Alternatively, as the gate insulator film 32, a film including an oxide, silicate, nitrided oxide, or oxidized nitrided silicate containing at least one kind selected from silicon (Si), aluminum (Al), yttrium (Y), zirconium (Zr), lanthanum (La), hafnium (Hf), and tantalum (Ta) may be used.

Specifically, silicon oxide ($SiO_2$), hafnium oxide ($HfO_2$) zirconium oxide ($ZrO_2$), lanthanum oxide ($La_2O_3$), yttrium oxide ($Y_2O_3$), tantalum oxide ($Ta_2O_5$), aluminum oxide ($Al_2O_3$), hafnium silicate ($HfSiO_x$), zirconium silicate ($ZrSiO_x$), zirconium titanate ($ZrTiO_x$), hafnium aluminum oxide ($HfAlO_x$), zirconium aluminum oxide ($ZrAlO_x$), and further, nitride of them (silicon oxynitride (SiON), hafnium silicide oxynitride (HfSiON), etc.) are cited. The relative permittivity of these materials may slightly vary depending on composition and crystalline property. For example, the relative permittivity of $HfO_2$ is 25 to 30, and the relative permittivity of $ZrO_2$ is 20 to 25.

Then, on the semiconductor substrate 11 including the inner surface of the groove part 31, a first conducting layer 47 including a first metal film (or a first metal compound film) is formed via the gate insulator film 32. For the first metal film, for example, hafnium (Hf) or lanthanoid metal is used, and the film is formed to have a thickness from 5 nm to 30 nm so as not to fill the groove part 31. As the first metal compound film, for example, hafnium silicide or silicide of lanthanoid metal is used, and the film is formed to have a thickness from 5 nm to 30 nm so as not to fill the groove part 31.

Note that, a film that controls a work function may be used for the first conducting layer 47.

For example, in the case of NFET, its gate electrode has a work function less than 4.6 eV, desirably equal to less than 4.3 eV. In the case of PFET, its gate electrode has a work function equal to or more than 4.6 eV, desirably equal to more than 4.9 eV.

For example, as an example of the work-function control film, there are metals of titanium (Ti), vanadium (V), nickel (Ni), zirconium (Zr), niobium (Nb), molybdenum (Mo), ruthenium (Ru), hafnium (Hf), tantalum (Ta), tungsten (W), platinum (Pt), alloys containing these metals, and compounds of these metals. As the metal compounds, there are metal nitrides and compounds of metal and semiconductor. The compounds of metal and semiconductor include a metal silicide as an example.

As an example of the work-function control film suitable for NFET, there are metals such as hafnium (Hf) and tantalum (Ta), and alloys containing these metals, and compounds of these metals, and specifically, hafnium silicide (HfSi$_x$) is more preferable. The hafnium silicide for NFET has a work function of about 4.1 eV to 4.3 eV.

As an example of the work-function control film suitable for PFET, there are metals such as titanium (Ti), molybdenum (Mo), and ruthenium (Ru) and alloys containing these metals, and compounds of these metals. Specifically, titanium nitride (TiN) or ruthenium (Ru) is more preferable. The titanium nitride for PFET has a work function of about 4.5 eV to 5.0 eV.

The first conducting layer 47 forms the gate electrode of the NFET and it is preferable to use the work-function control film suitable for the NFET.

Then, a resist mask (not shown) is formed on the pixel part formation region 16 and the formation region of the NFET of the peripheral circuit part formation region 17. Then, the first conducting layer 47 in the formation region of the PFET of the peripheral circuit part formation region 17 is removed using the resist mask as an etching mask. As a result, the gate insulator film 32 of the region where the PFET of the peripheral circuit part formation region 17 is formed is exposed.

Then, the resist mask is formed is removed.

Then, as shown in (2) in FIG. 21, a second conducting layer 48 including a second metal film (or a second metal compound film) is formed on the gate insulator film 32 including the first conducting layer 47. For the second conducting layer 48, a conducting layer having a different work function different from that of the first conducting layer 47 is used. For example, when a film having a work function suitable for NFET is used for the first conducting layer 47, a conducting layer having a work function suitable for PFET is used for the second conducting layer 48.

Note that, when a film having a work function suitable for PFET is used for the first conducting layer 47, a conducting layer having a work function suitable for NFET is used for the second conducting layer 48.

The work function control film suitable for the PFET includes metals such as titanium (Ti), molybdenum (Mo), and ruthenium (Ru), alloys containing these metals, and compounds of these metals. Specifically, titanium nitride (TiN) or ruthenium (Ru) is more preferable. The titanium nitride for PFET has a work function of about 4.5 eV to 5.0 eV.

Figure 22:
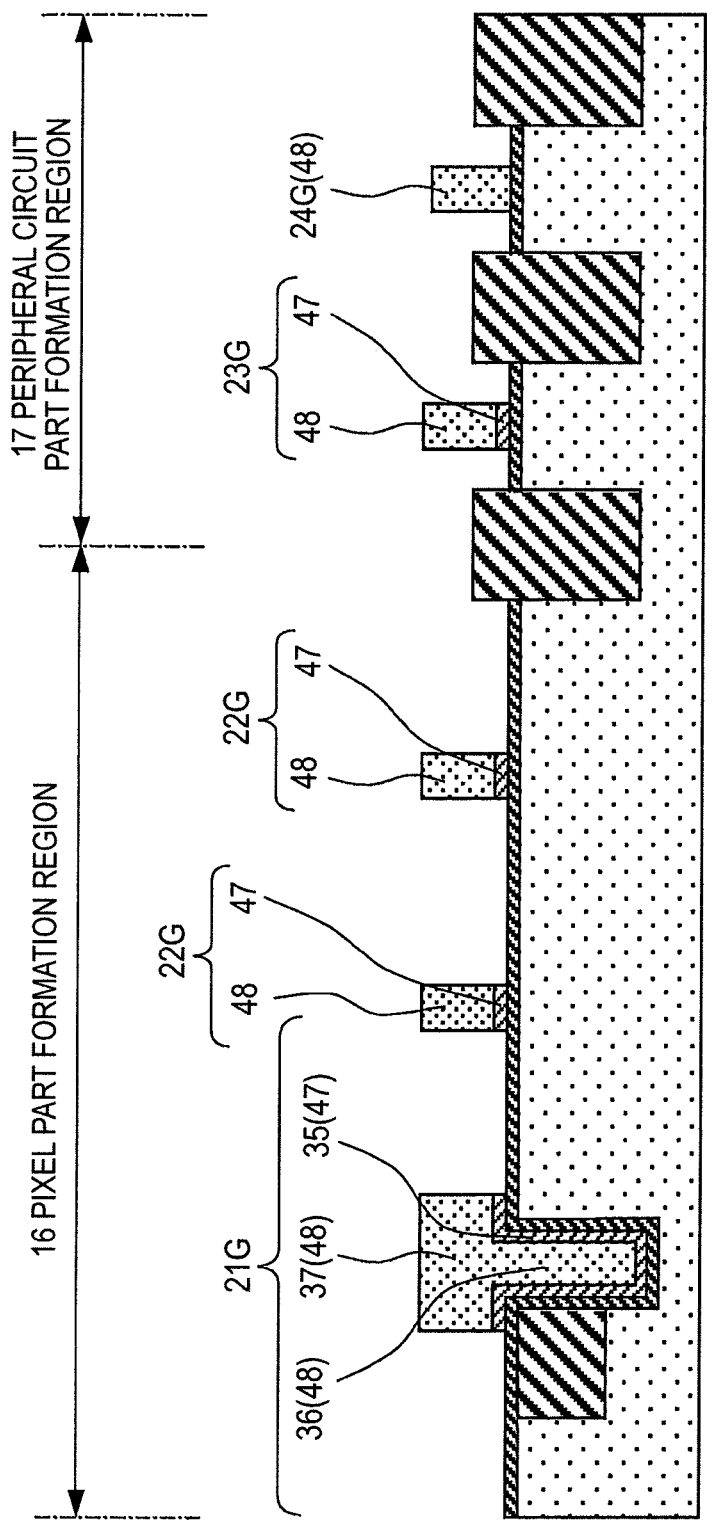
FIG. 22 is a manufacturing process sectional view showing an example of the fourth manufacturing method of a solid-state imaging device according to the eighth embodiment of the invention.

Then, as shown in FIG. 22(3), with the first conducting layer 47 and the second conducting layer 48, a gate electrode 21G of the vertical transistor, a gate electrode 22G of the planar transistor of the pixel part, and a gate electrode 23G of the NFET of the peripheral circuit part are formed. Further, with the second conducting layer 48, a gate electrode 24G of the PFET of the peripheral circuit part is formed.

Accordingly, the gate electrode 21G includes the conducting layer 35 formed by the first conducting layer 47, a filling layer 36 formed by the second conducting layer 48, and an electrode layer 37 formed by the second conducting layer 48. Further, the gate electrode 22G and the gate electrode 23G include the first conducting layer 47 and the second conducting layer 48. The gate electrode 24G includes the second conducting layer 48.

[Manufacturing Process of Photoelectric Conversion Part]

Further, a manufacturing process of the photoelectric conversion part is performed in the same manner as that explained in the first manufacturing method. Here, the formation location of the groove 31 relative to the photoelectric conversion part 51 is the same as that explained in the first manufacturing method.

[Manufacturing Process after Formation of Gate Electrodes of Transistors]

Furthermore, after the gate electrodes 21G to 24G of the respective transistors are formed, in the same manner as described according to FIG. 14 in the first manufacturing method, the semiconductor substrate 11 on both sides of the respective gate electrodes 21G to 24G, extension regions (not shown) and source and drain regions 25 to 30, and so on are formed. Moreover, on the semiconductor substrate 11, a wiring layer 81 is formed.

Then, though not shown, after a support substrate is formed at the wiring layer 81 side, the side of the semiconductor substrate 11 at which the photoelectric conversion part 51 is formed is ground or polished so that the semiconductor substrate 11 may have a desired thickness.

Then, a color filter layer, a collector lens (microlens), etc. are formed at the semiconductor substrate 11 side.

In the fourth manufacturing method of a solid-state imaging device according to the embodiment of the invention, the conducting layer 35 of the first conducting layer 47 including the first metal film or the first metal compound film formed on the inner surface of the groove part 31 via the gate insulating film 32 effectively functions as the gate electrode 21G. Further, the gate electrode 21G is formed by the filing layer 36 of the second metal film or the second metal compound film filling the interior of the groove part 31, and an electrode layer 37 of the second metal film or the second metal compound film connected to the first conducting layer 47. Therefore, it is not necessary to fill the groove part 31 with the conducting layer 35, and thus, it is not necessary to diffuse the impurity to the bottom of the groove part 31 in the polysilicon filling the groove part 31 by high-temperature heat treatment for forming the gate electrode of the vertical transistor unlike the technology in the past. Further, it is not necessary to perform ion implantation with high energy to allow the implanted ions to reach the bottom of the groove part 31 in the polysilicon filling the groove part 31.

For example, Y. Nishida et al., IEDM Tech. Dig., pp. 869-872, December 2001 discloses that, typically, in a surface channel CMOSFET as a planar transistor, it is necessary to form the gate electrode of NFET in N-type and the gate electrode of PFET in P-type.

Further, a technology using in-situ doped polysilicon for the respective gate electrodes of the vertical transistor and the planar transistor has been known. In the technology, there is a method of filling the vertical hole in which the vertical transistor is formed and forming the gate electrode of CMOSFET of the planar transistor. However, according to the method, it is difficult to make the CMOSFET because the conductivity of the gate of the NFET or PFET of the CMOSFET is inverted to the original conductivity.

In order to avoid this, it is conceivable that the gate electrode of the vertical transistor and the planar transistor are separately made, however, in this case, the number of steps is increased and the cost is increased. Further, when the gate of the planar transistor is worked, there is a level difference of the vertical transistor that has been formed before, and residues are left in the gate etching. Thereby, reduction in yield is caused.

On the other hand, in the fourth manufacturing method of a solid-state imaging device according to the embodiment of the invention, the gate electrodes 23G, 24G of the planar transistors (NFET 23, PFET 24) of the peripheral circuit part 13 are metal gates, and it is not necessary to separately form the gate electrode 23G of the NFET 23 and the gate electrode 24G of the PFET 24 in N-type and P-type, respectively. However, in the fourth manufacturing method, the gate electrode 23G of the NFET 23 and the gate electrode 24G of the PFET 24 are separately formed to have their optimum work functions. In addition, the gate electrodes 23G, 24G having minute gate lengths can be formed.

Therefore, the vertical transistor 21 and the planar transistors 22, NFET 23, PFET 24 having minute gate lengths are mounted on the same semiconductor substrate 11. Accordingly, there are advantages that the higher definition and higher density packaging of the transistors can be achieved and the higher definition and higher image processing speed can be realized. Further, reduction in yield is not caused unlike the technology in the past.

In the respective embodiments, the case where the first conductivity-type is N-type and the second conductivity-type is P-type has been explained, however, the first conductivity-type may be P-type and the second conductivity-type may be N-type.

9. Ninth Embodiment

One Example of Configuration of Imaging Apparatus

One example of a configuration of an imaging apparatus according to the ninth embodiment of the invention will be explained according to a block diagram in FIG. 23. For example, the imaging apparatus includes a video camera, digital still camera, a camera for cellular phone, etc.

As shown in FIG. 23, an imaging apparatus 300 includes a solid-state imaging device (not shown) in an imaging unit 301. An imaging optical unit 302 for collecting incident light and forming an image is provided at the light collection side of the imaging unit 301. Further, to the imaging unit 301, a signal processing unit 303 having a drive circuit that drives it, a signal processing circuit that processes signals photoelectrically converted by the solid-state imaging device into images, etc. are connected. Furthermore, the image signals processed by the signal processing unit may be stored in an image storage unit (not shown). In such an imaging apparatus 300, the solid-state imaging devices 1 to 4 of the embodiments of the invention may be used for the solid-state imaging device.

In the imaging apparatus 300, the solid-state imaging devices 1 to 4 of the embodiments of the invention are used. Since the solid-state imaging device that enables the higher definition and the higher speed of image processing speed is used, there is an advantage that high-definition video can be smoothly recorded.

Note that the imaging apparatus 300 is not limited to the above described configuration, but can be applied to any configuration as long as it is an imaging apparatus using a solid-state imaging device.

The solid-state imaging devices 1 to 4 may have forms of single chips or module forms having imaging functions in which the signal processing unit and the optical system are packaged together.

Further, the embodiments of the invention can be applied not only to the imaging apparatus but also to other imaging apparatuses. In this case, as the imaging apparatuses, higher image quality can be obtained. Here, the imaging apparatus refers to a portable device having a camera or imaging function. Further, "imaging" not only refers to shooting of images in the typical shooting with cameras, but also includes fingerprint detection in the broad sense.

The present application contains subject matter related to that disclosed in Japanese Priority Patent Application JP 2008-279471 filed in the Japan Patent Office on Oct. 30, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a pixel part having a photoelectric conversion part that photoelectrically converts incident light to obtain signal charge; and
   a peripheral circuit part formed on a periphery of the pixel part on a semiconductor substrate,
   the pixel part having a vertical transistor that reads out the signal charge from the photoelectric conversion part and a planar transistor that processes the signal charge read out by the vertical transistor,
   the vertical transistor having
      a groove part formed in the semiconductor substrate;
      a gate insulator film formed on an inner surface of the groove part;
      a conducting layer formed on a surface of the gate insulator film on the semiconductor substrate within and around the groove part;
      a filling layer filling an interior of the groove part via the gate insulator film and the conducting layer; and
      an electrode layer in electrical communication with the conducting layer located above the filling layer, and wherein the conducting layer includes polysilicon containing an N-type impurity or a P-type impurity, and
   the filling layer includes a metal or a metal compound or polysilicon formed separately from the conducting layer and further wherein a gate electrode of the vertical transistor and the planar transistor are each comprised of a same first and second polysilicon material.

2. The solid-state imaging device according to claim 1, wherein
   the filling layer includes non-doped polysilicon.

3. The solid-state imaging device according to claim 1, wherein the peripheral circuit part has an N-channel transistor and a P-channel transistor,
   a gate electrode of the N-channel transistor is of N-type, and
   a gate electrode of the P-channel transistor is of P-type.

4. The solid-state imaging device according to claim 1, wherein the peripheral circuit part has an N-channel transistor and a P-channel transistor,
   a first gate electrode of the N-channel transistor is formed by a metal or a metal compound having conductivity, and
   a second gate electrode of the P-channel transistor is formed by a metal or a metal compound having conductivity having a work function higher than that of the first gate electrode.

5. A solid-state imaging device comprising:
   a pixel part having a photoelectric conversion part that photoelectrically converts incident light to obtain signal charge; and
   a peripheral circuit part formed on a periphery of the pixel part on a semiconductor substrate,
   the pixel part having a vertical transistor that reads out the signal charge from the photoelectric conversion part and a planar transistor that processes the signal charge read out by the vertical transistor, the vertical transistor having
a groove part formed in the semiconductor substrate;
a gate insulator film formed on an inner surface of the groove part;
a conducting layer formed on a surface of the gate insulator film on the semiconductor substrate within and around the groove part;
a filling layer filling an interior of the groove part via the gate insulator film and the conducting layer; and
an electrode layer in electrical communication with the conducting layer located above the filling layer, and wherein the conducting layer includes a metal or a metal compound, and
the filling layer includes a metal or a metal compound or polysilicon formed separately from the conducting layer, wherein the conducting layer includes a metal or a metal compound having conductivity, and
the filling layer includes a metal or a metal compound different from that of the conducting layer or polysilicon and further wherein a gate electrode of the vertical transistor and the planar transistor are each comprised of a same first and second polysilicon material.

6. The solid-state imaging device according to claim 5, wherein the conducting layer includes a metal or a metal compound that controls a work function of the vertical transistor.

7. An imaging apparatus comprising:
an imaging optical unit that collects incident light;
a solid-state imaging device that receives and photoelectrically converts the light collected by the imaging optical unit; and
a signal processing unit that processes a photoelectrically converted signal,
wherein the solid-state imaging device includes a pixel part having a photoelectric conversion part that photoelectrically converts incident light to obtain signal charge and a peripheral circuit part formed on a periphery of the pixel part on a semiconductor substrate,
the pixel part has a vertical transistor that reads out the signal charge from the photoelectric conversion part and a planar transistor that processes the signal charge read out by the vertical transistor, and
the vertical transistor has
a groove part formed in the semiconductor substrate;
a gate insulator film formed on an inner surface of the groove part,
a conducting layer formed on a surface of the gate insulator film on the semiconductor substrate within and around the groove part,
a filling layer filling an interior of the groove part via the gate insulator film and the conducting layer, and
an electrode layer connected to the conducting layer on the filling layer, and wherein the conducting layer includes polysilicon containing an N-type impurity or a P-type impurity, and
the filling layer includes a metal or a metal compound or polysilicon formed separately from the conducting layer and further wherein a gate electrode of the vertical transistor and the planar transistor are each comprised of a same first and second polysilicon material.

* * * * *